(12) United States Patent
Lee et al.

(10) Patent No.: US 10,847,533 B2
(45) Date of Patent: *Nov. 24, 2020

(54) THREE-DIMENSIONAL STRUCTURED MEMORY DEVICES

(71) Applicant: Micron Technology, Inc., Boise, ID (US)

(72) Inventors: Ki Hong Lee, Suwon-si (KR); Seung Ho Pyi, Yongin-si (KR); Il Young Kwon, Seoul (KR); Jin Ho Bin, Seoul (KR)

(73) Assignee: Micron Technology, Inc., Boise, ID (US)

( * ) Notice: Subject to any disclaimer, the term of this patent is extended or adjusted under 35 U.S.C. 154(b) by 93 days.

This patent is subject to a terminal disclaimer.

(21) Appl. No.: 16/123,798

(22) Filed: Sep. 6, 2018

(65) Prior Publication Data

US 2019/0088677 A1  Mar. 21, 2019

Related U.S. Application Data

(60) Continuation of application No. 15/633,144, filed on Jun. 26, 2017, now Pat. No. 10,096,617, which is a
(Continued)

(51) Int. Cl.
*H01L 27/11582* (2017.01)
*H01L 29/66* (2006.01)
(Continued)

(52) U.S. Cl.
CPC .... *H01L 27/11582* (2013.01); *G11C 16/0483* (2013.01); *G11C 16/10* (2013.01); *G11C 16/14* (2013.01); *G11C 16/26* (2013.01); *H01L 21/02532* (2013.01); *H01L 21/02595* (2013.01); *H01L 21/2236* (2013.01); *H01L 21/26513* (2013.01); *H01L 27/1157* (2013.01); *H01L 27/11524* (2013.01); *H01L 27/11556* (2013.01); *H01L 29/04* (2013.01); *H01L 29/0847* (2013.01); *H01L 29/1037* (2013.01); *H01L 29/16* (2013.01); *H01L 29/66833* (2013.01); *H01L 29/7926* (2013.01); *H01L 21/324* (2013.01)

(58) Field of Classification Search
CPC ......... H01L 27/11521; H01L 27/11524; H01L 27/11551; H01L 27/11556; H01L 27/11582
See application file for complete search history.

(56) References Cited

U.S. PATENT DOCUMENTS 4,914,501 A * 4/1990 Rivoli ................... H01L 23/485
                                                        257/372
6,649,982 B2 * 11/2003 Pan ...................... H01L 21/8249
                                                        257/370
(Continued)

*Primary Examiner* — Yu-Hsi D Sun
(74) *Attorney, Agent, or Firm* — Schwegman Lundberg & Woessner, P.A.

(57) ABSTRACT

A 3D structured nonvolatile semiconductor memory devices and methods for manufacturing are disclosed. One such device includes an n+ region at a source/drain region; a p+ region at the source/drain region; and a diffusion barrier material between the n+ region and the p+ region. The n+ region is substantially isolated from the p+ region.

18 Claims, 27 Drawing Sheets

Related U.S. Application Data continuation of application No. 14/942,533, filed on Nov. 16, 2015, now Pat. No. 9,691,785, which is a division of application No. 14/263,322, filed on Apr. 28, 2014, now Pat. No. 9,190,416, which is a division of application No. 13/234,422, filed on Sep. 16, 2011, now Pat. No. 8,709,894.

(51) Int. Cl.

| | | |
|---|---|---|
| *H01L 29/792* | (2006.01) | |
| *H01L 21/223* | (2006.01) | |
| *H01L 21/02* | (2006.01) | |
| *H01L 21/265* | (2006.01) | |
| *H01L 27/11556* | (2017.01) | |
| *H01L 29/08* | (2006.01) | |
| *G11C 16/04* | (2006.01) | |
| *G11C 16/10* | (2006.01) | |
| *G11C 16/14* | (2006.01) | |
| *G11C 16/26* | (2006.01) | |
| *H01L 27/11524* | (2017.01) | |
| *H01L 27/1157* | (2017.01) | |
| *H01L 29/04* | (2006.01) | |
| *H01L 29/10* | (2006.01) | |
| *H01L 29/16* | (2006.01) | |
| *H01L 21/324* | (2006.01) | |

(56) References Cited

U.S. PATENT DOCUMENTS

| | | |
|---|---|---|
| 8,178,919 B2 | 5/2012 | Fujiwara et al. |
| 8,188,530 B2 | 5/2012 | Tanaka et al. |
| 8,709,894 B2 | 4/2014 | Lee et al. |
| 9,190,416 B2 | 11/2015 | Lee et al. |
| 9,691,785 B2 | 6/2017 | Lee et al. |
| 2012/0104484 A1 | 5/2012 | Lee et al. |
| 2012/0299076 A1 | 11/2012 | Yoo et al. |
| 2013/0009229 A1 | 1/2013 | Lee et al. |
| 2013/0069152 A1 | 3/2013 | Lee et al. |
| 2014/0227842 A1 | 8/2014 | Lee et al. |
| 2016/0071880 A1 | 3/2016 | Lee et al. |
| 2017/0294447 A1 | 10/2017 | Lee et al. |

* cited by examiner

FIG. 4

|  |  | SL | Ssl' | Unsel. WL | Sel. WL | Dsl' | BL |
|---|---|---|---|---|---|---|---|
| PGM | | Vdc | 0V | Vpass | Vpgm | Vdc | 0V |
| Read/VFY | | 0V | Vdc | Vread | Read Level | Vdc | 1V |
| Erase | embodiment 1 | Verase | F | 0V | 0V | F | F |
| | embodiment 2 | 0V | F | Nega_Verase | Nega_Verase | F | 0V or F |

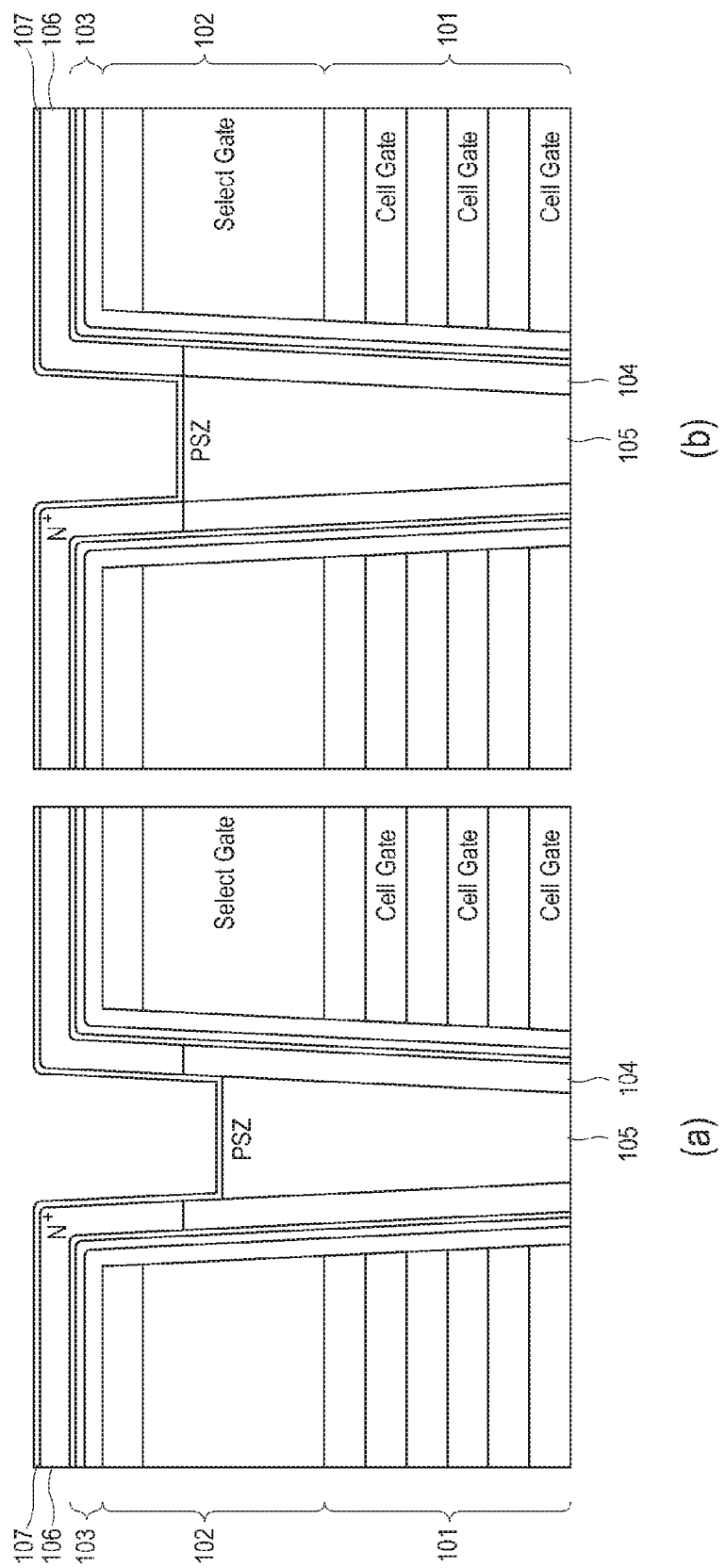

THREE-DIMENSIONAL STRUCTURED MEMORY DEVICES

PRIORITY APPLICATION

This application is a continuation of U.S. application Ser. No. 15/633,144, filed Jun. 26, 2017, issued as U.S. Pat. No. 10,096,617, which is a continuation of U.S. application Ser. No. 14/942,533, filed Nov. 16, 2015, issued as U.S. Pat. No. 9,691,785, which is a divisional of U.S. application Ser. No. 14/263,322, filed Apr. 28, 2014, now issued as U.S. Pat. No. 9,190,416, which is a divisional of U.S. application Ser. No. 13/234,422, filed on Sep. 16, 2011, issued as U.S. Pat. No. 8,709,894, all of which are incorporated herein by reference in their entirety.

TECHNICAL FIELD

The present disclosure relates generally to a memory device and, in particular, to a three-dimensional (3D) structured NAND flash memory device.

BACKGROUND

Memory devices are used to store data or programs for computers and other electronic devices. Common types of memory include optical storage, such as CDs and DVDs; magnetic storage, such as hard disc drives; and semiconductor memory. Semiconductor memory is a type of memory that is implemented on semiconductor-based integrated circuits. Semiconductor memory can be either volatile or nonvolatile. Volatile memory refers to memory that loses its data when there is no active power source. Nonvolatile memory, on the other hand, does not lose its data when there is no active source. Thus, nonvolatile memory is often used for storage solutions since it does not require an active power source.

While there are many different types of nonvolatile semiconductor memory, one of the most widely used types is flash memory. Flash memory is often found in devices such as mobile phones, MP3 players, USB drives, digital cameras, etc.

Flash memory may be either NOR flash memory or NAND flash memory. NAND flash memory generally has greater storage density, lower cost per bit, and greater endurance than NOR flash memory. Due to the demand for larger data storage capacities, new technologies are frequently being implemented to further shrink the size of a NAND memory cell, thus increasing the storage density, in order to improve this capacity.

NAND flash memory is typically made up of two-dimensional cell array structures. However, the size of two-dimensional NAND flash memory cells is expected to reach its technological limit, estimated to be around 20 nm. Thus, there have been several proposals for a three-dimensional cell array structure for NAND flash memory to allow for further reduction in size. Using a 3D structure, it is estimated that NAND flash memory can achieve higher data storage capacity and effectively lower fabrication cost without relying on advances in lithography technology.

3D structured NAND flash memory uses tunneling for write operations and hole injection for erase operations. Tunneling occurs when a charge is applied to a semiconductor, enabling electrons to move across an insulating layer to provide a charge to a charge storage structure in the semiconductor. Hole injection refers to the opposite effect, where a charge is applied to a semiconductor to provide holes for electrons to move across the insulating layer in order to remove a charge from the charge storage structure. Several candidates for 3D structured NAND flash memory have been proposed, such as P-BiCS (Pipe-shaped Bit Cost Scalable), TCAT (Terabit Cell Array Transistor), VSAT (Vertical Stacked Array Transistor), and VG (Vertical Gate). In a TCAT structure, for example, holes for hole injection may be provided by a hole reservoir in the substrate. For P-BiCS, however, there is no hole reservoir for hole injection.

Thus, in a BiCS-type structure, such as P-BiCS, the generation of holes by gate induced drain leakage (GIDL) is required to perform an erase operation on a vertical NAND string. This involves applying a voltage to a string selection transistor in order to generate a GIDL current. The high electric fields near the string selection transistor junction result in GIDL current generation such that holes get injected into a vertical channel of the string. This sets the potential of the vertical channel of the string such that a negative potential can be applied to any cell gate to erase a cell in the string.

GIDL, however, requires large electric fields within the gate-drain overlap region of a device. These fields produce hot carriers that can lead to gate dielectric degradation of the selection transistor. In addition, integration process control (doping profile control) to form GIDL is difficult.

BRIEF DESCRIPTION OF THE DRAWINGS

FIG. 4 shows the operation voltages illustrating operations of a 3d structured nonvolatile semiconductor memory device according to some embodiments.

FIGS. 5A through 5K are cross-sectional views illustrating a method of manufacturing a 3d structured nonvolatile semiconductor memory device according to a first embodiment.

DETAILED DESCRIPTION

Figure 1:
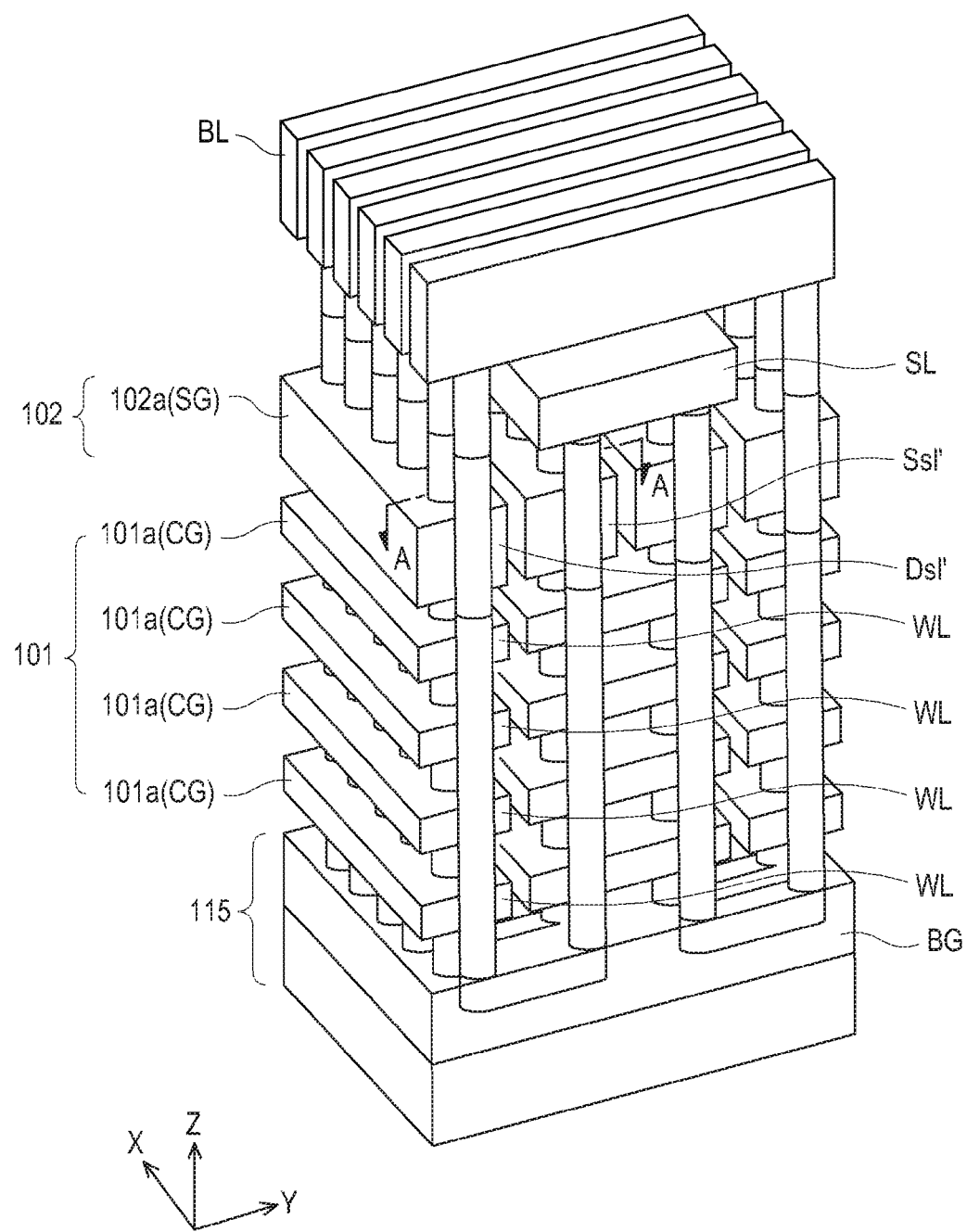
FIG. 1 is a perspective view of a 3d structured nonvolatile semiconductor memory device.

The present disclosure is directed to, for example, a 3D structured nonvolatile semiconductor memory device. One embodiment includes forming an n+ region and a p+ region at a source region and drain region of a 3D structured nonvolatile semiconductor memory device. Alternatively, the n+ region and p+ region may be formed at only one of the source and drain regions of the 3D structured nonvolatile semiconductor memory device. According to one or more of these embodiments, erase operations of the 3D structured nonvolatile semiconductor memory device can be performed without forming GIDL, and the erase operation performance and reliability of the selection transistor can be enhanced.

The foregoing summary is illustrative only and is not intended to be in any way limiting. In addition to the illustrative aspects, embodiments, and features described above, further aspects, embodiments, and features will become apparent by reference to the drawings and the following detailed description.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Figure 2:
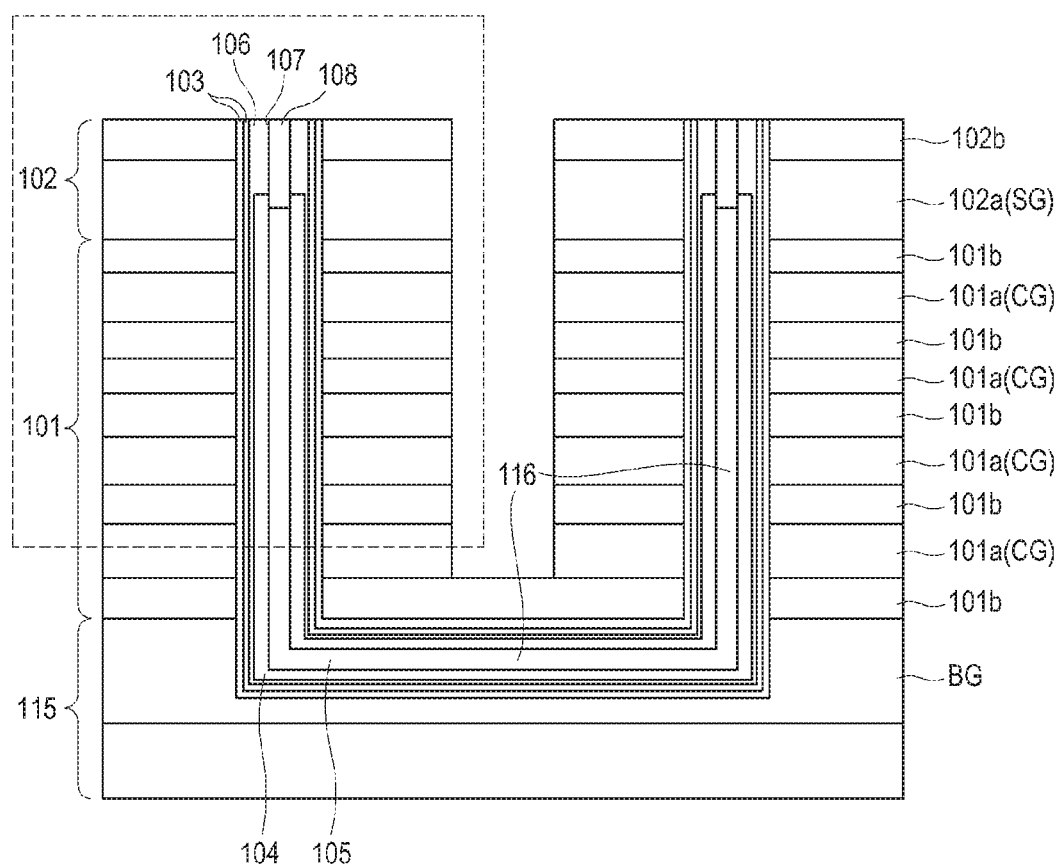
FIG. 2 is a cross-sectional view of the 3d structured nonvolatile semiconductor memory device taken along an A-A line of FIG. 1.

FIG. 1 illustrates a perspective view of one example of a 3d structured nonvolatile semiconductor memory device. FIG. 2 depicts a cross-sectional view of the 3d structured nonvolatile semiconductor memory device that is taken along an A-A line of FIG. 1. A nonvolatile semiconductor memory 100 device includes a semiconductor substrate 115. A memory cell formation region, which contain memory cells, and a peripheral part (not illustrated), which contain peripheral circuits, are formed on the semiconductor substrate 115. The peripheral part may be disposed around the memory cell formation region.

The semiconductor substrate 115 may include a back gate BG. A plurality of Cell Gates 101a are alternately formed (e.g., deposited, made, or otherwise provided) with a plurality of cell gate insulating layers 101b (as shown in FIG. 2) on the memory cell formation region of the semiconductor substrate 115. The plurality of Cell Gates 101a and the plurality of cell gate insulating layers 101b collectively form a cell transistor part 101. The Cell Gates 101a may be formed of, for example, poly-silicon. The cell gate insulating layers 101b may be formed of, for example, silicon oxide (SiO$_2$) and function as inter-layer insulating layers to insulate the Cell Gates 101a from each other.

A select gate 102a and a select gate insulating layer 102b (as shown in FIG. 2) are formed in this order over (e.g., on) the cell transistor part 101. The select gate 102a and the select gate insulating layer 102b collectively form a selection transistor part 102. The select gate 102a may be formed of, for example, poly-silicon. The select gate 102a may be formed in the region directly above an uppermost Cell Gate 101a. As described below, the select gates can include a select gate Dsl' on a bit line side and select gate Ssl' on a source line side.

Referring to FIG. 2, a U-shaped opening (e.g., hole) 116 is formed in the cell transistor part 101, the selection transistor part 102, and the semiconductor substrate 115. An ONO layer (Oxide-Nitride-Oxide layer) 103 is formed on the inner face of the U-shaped opening 116. The ONO layer 103 includes an insulative block layer 103a, a charge storage layer 103b, and an insulative tunneling layer 103c stacked in this order from the outer portion of the U-shaped opening 116 toward the center thereof. The insulative block layer 103a contacts the semiconductor substrate 115, the cell transistor part 101, and the selection transistor part 102. The insulative block layer 103a and the insulative tunneling layer 103c may be made of, for example, silicon oxide. The charge storage layer 103b may be made of, for example, silicon nitride.

A channel material, such as undoped channel poly-silicon 104, is formed on the inner face of the ONO layer 103 in the U-shaped opening 116. A spin on dielectric (SOD) can fill any remaining interior of the U-shaped opening 116, forming an inter-dielectric 105. The SOD may be, for example, polysilazane (PSZ). The channel poly-silicon layer 104 is insulated from the back gate BG and the Cell Gates 101a by the ONO layer 103. The U-shaped hole 116, the ONO layer 103, the undoped channel material 104, and the inter-dielectric 105 collectively form a pipe channel part. Alternately, the undoped channel poly-silicon layer 104 and inter-dielectric 105 may be omitted, where an undoped channel poly-silicon 109 can fill any remaining interior area of the U-shaped opening 116.

Source lines SL are formed over a select gate insulating layer 102b formed over one end of the U-shaped hole 116. The source lines SL are disposed in the region directly above every other one of the cell gate electrodes CG of the uppermost layer. Bit lines BL are formed over the select gate insulating layer 102b formed over the end of the U-shaped hole 116 opposite the source line SL. The source lines SL and the bit lines BL may be formed from metal layers, for example. The select gates may be arranged to connect to a common source line SL and mutually different bit lines BL.

Vertical memory transistors are formed between the undoped channel material 104 and each Cell Gate 101a. Each of the memory transistors functions as a memory cell by storing electrons in the charge storage layer 103b.

A selection transistor is formed between the undoped channel material 104 and the select gate electrode SG.

Figure 3:
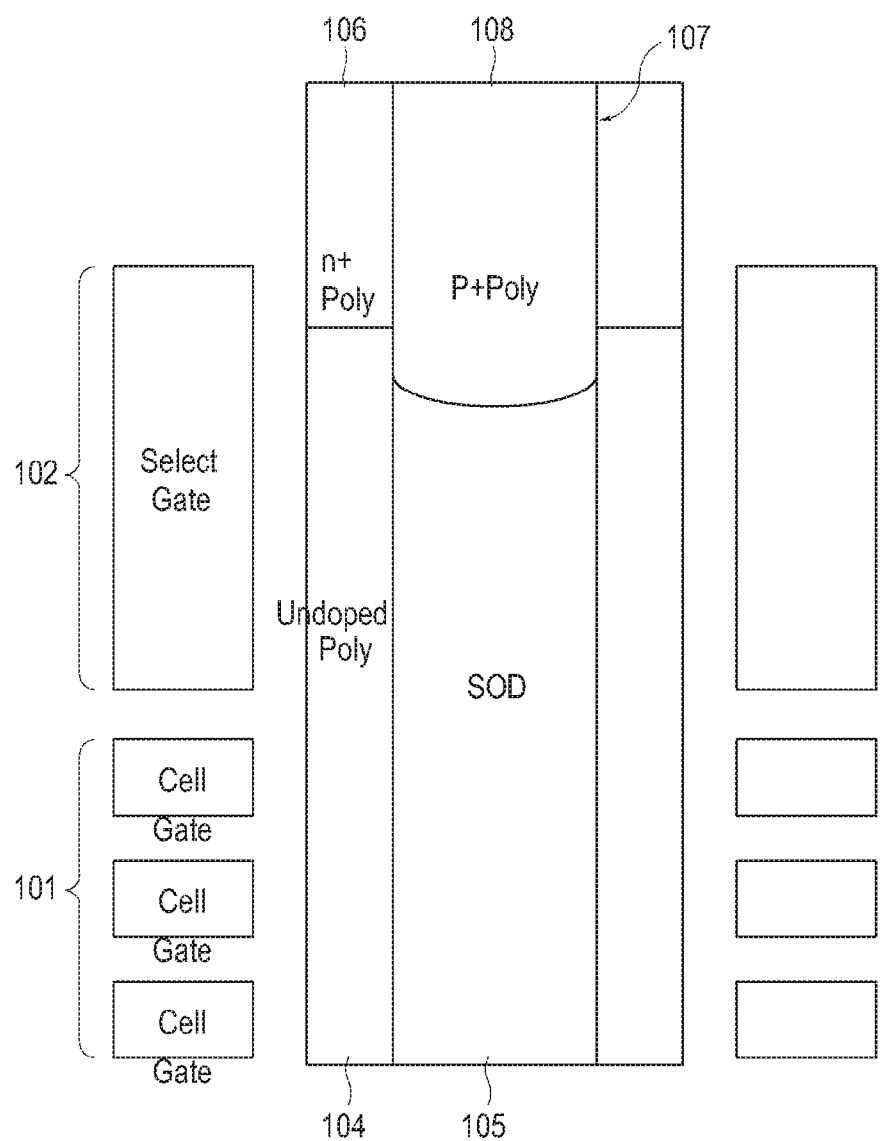
FIG. 3 is a cross-sectional view of a portion of the 3d structured nonvolatile semiconductor memory device with an n+ poly-silicon region and a p+ poly-silicon region.

FIG. 3 shows part of the 3d structured nonvolatile semiconductor memory device (e.g., as shown in FIG. 2) according to one embodiment. The depicted memory device has a SONOS (Silicon-Oxide-Nitride-Oxide-Silicon) or MONOS (Metal-Oxide-Nitride-Oxide-Silicon) structure, but other embodiments may use a doped poly-silicon floating gate as the charge storage layer. The memory channel may have a cylindrical structure. In the present embodiment, an undoped channel material 104 is formed between the ONO layer 103 (not shown in FIG. 3) and the inter-dielectric 105. An n+ region 106 is formed at a source/drain region. In addition, a p+ region 108 is formed at the source/drain region. A diffusion barrier material 107 is formed between the n+ region 106 and the p+ region 108, wherein the n+ region 106 is substantially isolated from the p+ region 108. The diffusion barrier material 107 may extend beyond the n+ region 106 so that a portion of the diffusion barrier material 107 is adjacent to a portion of the undoped channel material 104. The diffusion barrier material may also be configured to substantially isolate the p+ region 108 from the interdielectric 105, as well as the n+ region 106. The concentration of a p-type dopant in the p+ region 108 may be lower than the concentration of an n-type dopant in the n+ region 106. The diffusion barrier material 107 can comprise a dielectric such as silicon nitride. Alternatively, the diffusion barrier material 107 can comprise a metal such as titanium nitride (TiN). The diffusion barrier material 107 can aid in maintaining the n+ region 106 since a p-type dopant such as boron can be easily diffused to the n+ region 106. The p+ region 106 may comprise a p+ region and a p– region, wherein the concentration of the p-type dopant is greater in the p+ region than in the p– region.

The p+ region 108 provides holes for hole injection, thus an erase operation can be performed without forming GIDL.

The read, write, and erase operations of a 3d structured nonvolatile semiconductor memory device according to some embodiments of the present disclosure will now be described below in detail. FIG. 4 illustrates a table describing the read, write, and erase operations of the nonvolatile semiconductor memory device according to one such embodiment.

A program operation for a memory cell of the memory device may be performed by selecting a bit line BL or source line SL, a select gate line (Ssl' and Dsl'), and a wordline WL. Select gate lines are connected to and/or formed by the Select Gates 102a of the memory device and wordlines WL are connected to and/or formed by Cells Gates 101a of the memory device. A difference between voltages at a selected wordline (Sel. WL indicated in FIG. 4) and a channel region of a selected memory cell allows charges to be injected into a charge storage layer 103b of the selected memory cell.

As show in the PGM row of the table in FIG. 4, in order to program memory cells independently, a program voltage Vpgm may be applied to the selected wordline (Sel. WL) corresponding to the selected memory cell and a pass voltage Vpass may be applied to the unselected wordlines (Unsel. WL). Thus, the pass voltage Vpass may turn on unselected memory cells. A bit line (BL) may be grounded, and a source line (SL) may be supplied with a power supply voltage Vdc. A drain side select gate line (Dsl') is supplied with the power supply voltage Vdc to turn on all string selection transistors connected to the drain side select gate line (Dsl'). Accordingly, a high voltage difference (Vpgm–0 [V]) may be applied to a gate and a channel region of the selected memory cell and a low voltage difference (Vpgm–Vdc [V]) may be applied to a gate and a channel region of an unselected memory cell connected to the source line (SL). The high voltage difference (Vpgm–0 [V]) may allow the selected memory cells to be programmed using tunneling.

The source side select gate line (Ssl') may be grounded to turn on all selected transistors connected to the source side select gate line (Ssl'). A self-boosting scheme may be employed to prevent memory cells connected to the bit line (BL) and the source side select gate line (Ssl') from being programmed unintentionally. The channel structure may function as a body of a conventional memory device. The channel structure may be electrically connected to a semiconductor substrate 115 to be grounded during a program operation.

A read operation for the memory device according to an embodiment may be performed by sensing read current flowing between the string selection transistors. The read current may be dependent upon a threshold voltage based on an amount of charge stored in a charge storage layer 103b. A difference of the read current can be used to determine information stored in the memory cell.

As indicated in the Read/VFY row of the table in FIG. 4, during the read operation, a selected wordline (Sel. WL) may be supplied with a read level value of the threshold voltage. A bit line (BL) may be supplied with a power supply voltage of 1 V, select gate lines (Ssl' and Dsl') may be supplied with a power supply voltage Vdc. and a source line (SL) may be grounded. The unselected wordlines (Unsel. WL) may be supplied with a read voltage Vread to turn on transistors connected to the selected memory string. According to a threshold voltage of the selected memory cell, current may flow between the bit line (BL) and the source line (SL). The current flowing in the bit line (BL) may vary with the information storing state of the selected memory cell.

During an erase operation, all memory cells of a particular block of an array may be erased at the same time. According to one embodiment of the present disclosure, as indicated in Erase row (embodiment 1) of the table in FIG. 4, the source line (SL) may be supplied with a positive erase voltage Verase and the wordlines (Unsel. WL and Sel. WL) may be grounded. The erase voltage Verase may be greater than a program voltage Vpgm. The select gate lines (Ssl' and Dsl') and the bit line (BL) are left floating (F). According to another embodiment, as indicated in Erase row (embodiment 2) of the table in FIG. 4, the source line (SL) may be grounded, the bit line (BL) may be grounded or left floating (F), the select gate lines (Ssl' and Dsl') may be left floating (F), and the wordlines (Unsel. WL and Sel. WL) may be supplied with a negative erase voltage Nega_Verase. Thus, according to the above two embodiments, an erase operation may be performed by either an FG (floating gate) method or a method of applying a negative bias to wordlines WL.

Embodiments 1 and 2 of the erase operation and other operations as described above with reference to FIG. 4 are merely exemplary for explaining the operations of the memory device, and operational features of the memory device are not limited thereto. That is, it is apparent to a person of ordinary skill in the art that modifications may be readily made based on related arts. Therefore, the features associated with the operation method may be embodied through various modifications and changes based on the related arts.

A method for manufacturing a 3D structured nonvolatile semiconductor memory device according to some embodiments of the present disclosure will now be described below in detail.

FIGS. 5A through 5K illustrate a method of manufacturing a 3D structured nonvolatile semiconductor memory device having a cylindrical structure (e.g., the memory device as shown in FIGS. 1 to 3) according to one embodiment of the present disclosure.

Figure 5A:
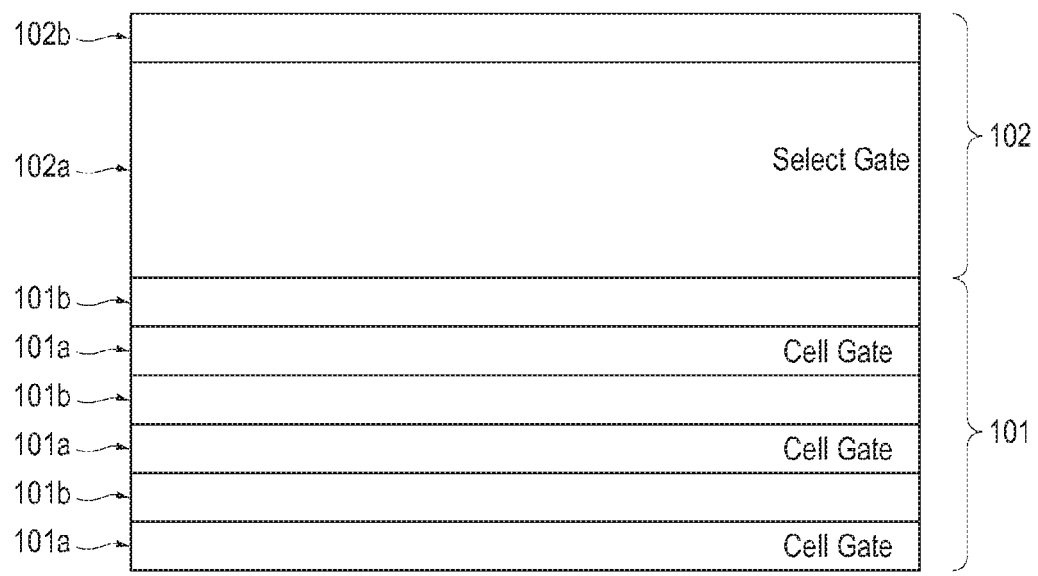

As shown in FIG. 5A, a cell transistor part 101 is formed over a semiconductor substrate (not shown), e.g., the semiconductor substrate 115 as shown in FIGS. 1 and 2. As shown in FIG. 5A, the cell transistor part 101 includes a plurality of Cell Gates 101a alternately formed with a plurality of gate insulating layers 101b over the semiconductor substrate. Each Cell Gate 101a is insulated from the neighboring Cell Gates 101a by a gate insulating layer 101b. The Cell Gates 101a alternately formed with the gate insulating layers 101b over the semiconductor substrate collectively form the cell transistor part 101. The gate insulating layers 101b may be, for example, oxide insulator layers, such as silicon oxide. The Cell Gates 101a may be made of, for example, poly-silicon. A Select Gate 102a is formed over the cell transistor part 101. The Select Gate 102a may be made of, for example, amorphous silicon. Subsequently, an oxide insulator layer 102b is formed over the Select Gate 102a. The Select Gate 102a and the oxide insulator layer 102b collectively form a selection transistor part 102. The cell transistor part 101 and the selection transistor part 102 may be formed over the semiconductor substrate using, for example, any type of deposition methods known in the related art.

Figure 5B:
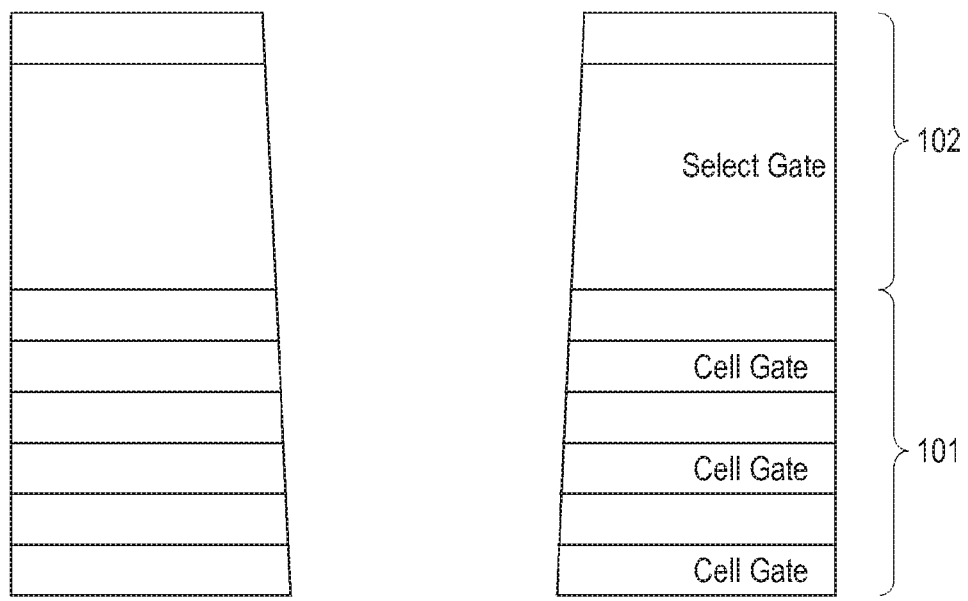

Subsequently, as shown in FIG. 5B, an opening is created in a center portion of the cell transistor part 101 and the selection transistor part 102. The opening may form part of a U-shaped opening 116 passing through the cell transistor part 101, the selection transistor part 102 and the semiconductor substrate (e.g., the U-shaped opening 116 as shown in FIG. 2). For example, the opening within the selection transistor part 102 and the cell transistor part 101 may be formed by forming a nitride (NIT), carbon, and anti-reflective coating (ARC) to form a hard mask and etching the center portion thereof using the hard mask as an etch mask.

Figure 5C:
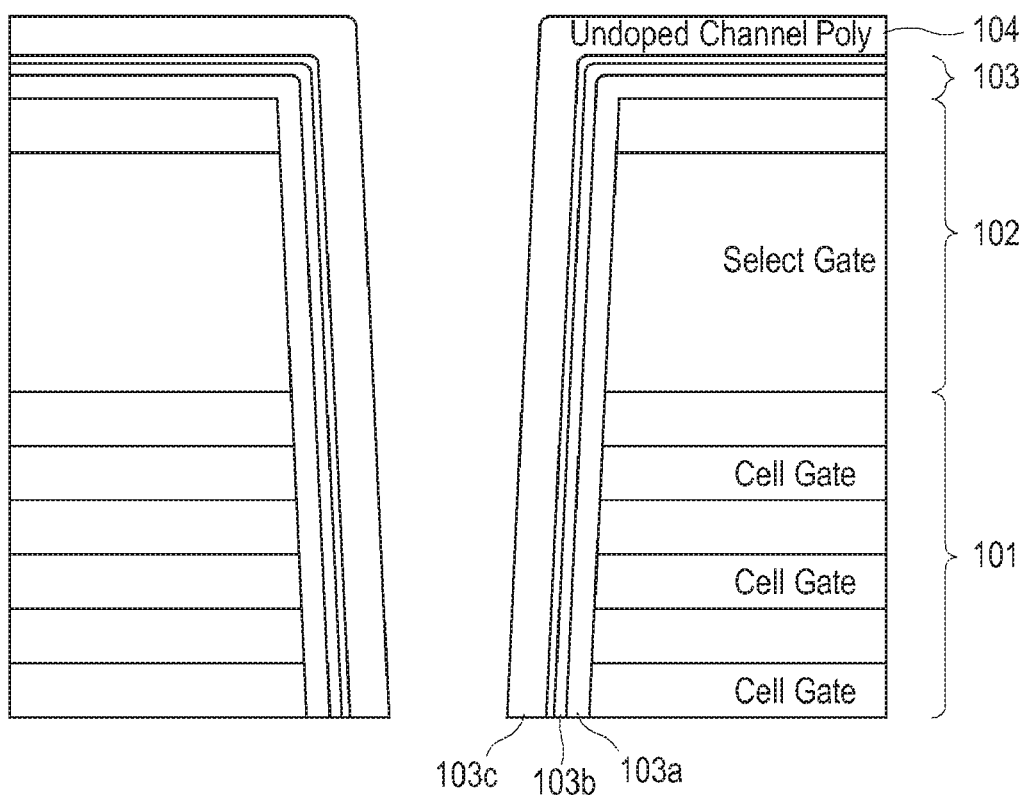

Then, as shown in FIG. 5C, a tunnel dielectric layer (ONO layer 103) and an undoped channel material 104 are sequentially formed in the opening. The ONO layer 103 and the undoped channel material 104 collectively form a pipe channel part in the U-shaped opening 116.

Specifically, an insulative block layer 103a, a charge storage layer 103b, and an insulative tunneling layer 103c are sequentially formed in the opening, forming the ONO layer 103. The insulative block layer 103a may be, for example, a blocking oxide layer. The charge storage layer 103b may be, for example, a charge trap nitride layer. The insulative tunneling layer 103c may be, for example, a tunnel oxide layer. An undoped channel material 104 is then formed over the ONO layer 103 in the opening.

Figure 5D:
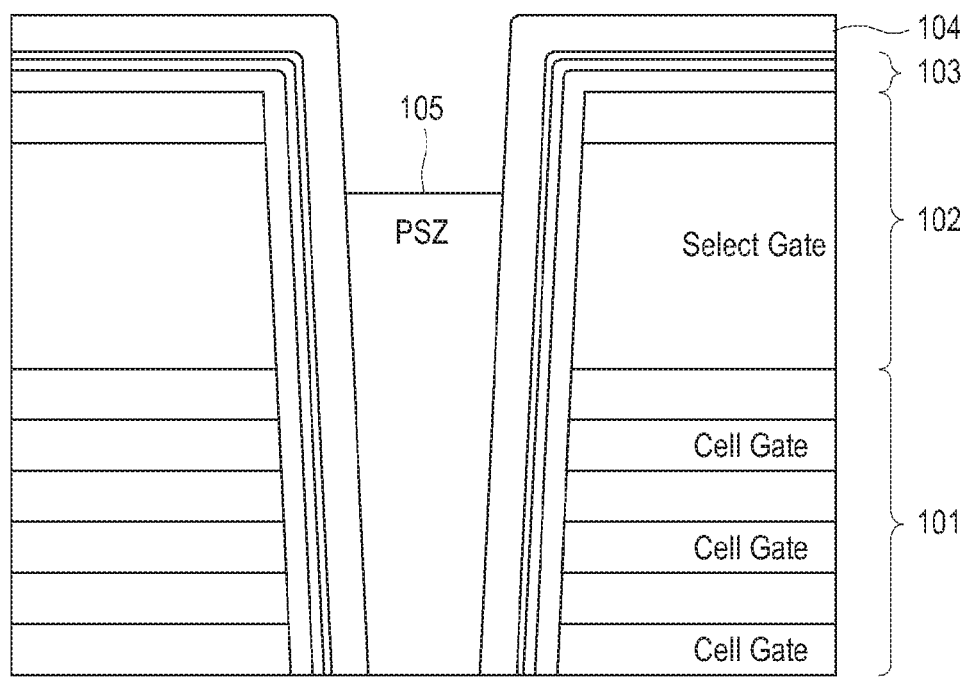

In the next operation, as shown in FIG. 5D, an inter-dielectric 105 is formed in the opening. The inter-dielectric 105 may be formed by, for example, gap-filling the opening using a spin-on dielectric (SOD), such as polysilazane (PSZ). A planarization process by chemical mechanical polishing (CMP) may be performed on the inter-dielectric 105. The planarized SOD may then be coated. Alternatively, the SOD may be cured. The inter-dielectric 105 may be selectively recessed (e.g., by etching or otherwise removing) to expose an n+ region 106 of the undoped channel material 104 that will form the n+ region 106.

Figure 5E:
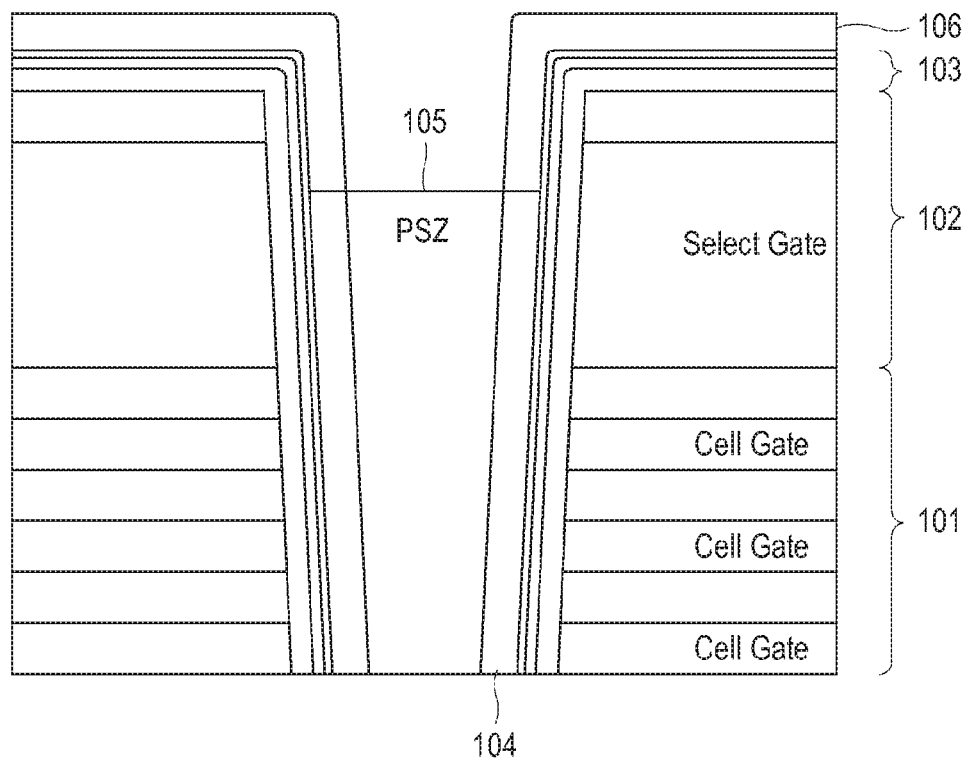

FIGS. 5E through 5K illustrate a method for forming an n+ region 106 and a p+ region 108 at a source/drain region of a 3D structured nonvolatile semiconductor memory device. FIG. 5E depicts forming an n+ region 106 in the exposed region 106. The n+ region 106 can be formed by, for example, subjecting the exposed region 106 to plasma doping or annealing in $PH_3$ atmosphere.

Figure 5F:
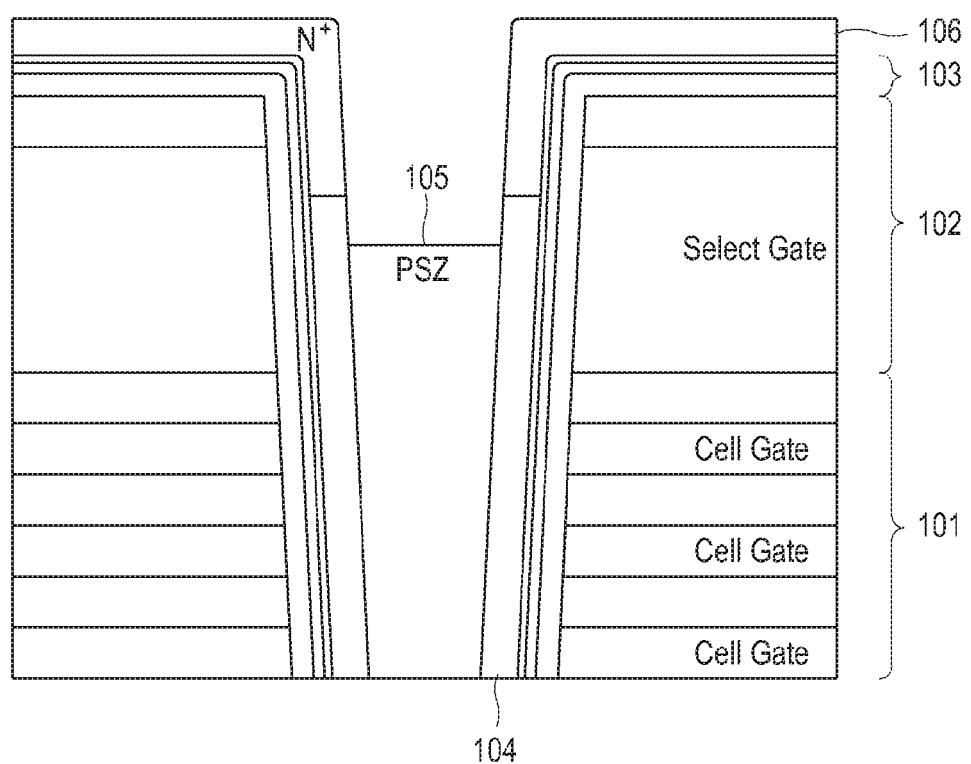

As shown in FIG. 5F, in one or more embodiments, an upper surface of the inter-dielectric 105 may be further recessed to expose another region of the undoped channel material 104 adjacent to the n+ region 106. As shown in FIG. 5G(a), a diffusion barrier material 107 may then be formed in the recess over the n+ region 106, the exposed region of the undoped channel material 104 and an upper surface of the inter-dielectric 105. This may aid in suppressing diffusion between an n-type dopant and p-type dopant, since a dopant may potentially diffuse around the diffusion barrier material 107.

In an alternate embodiment, the upper surface of the inter-dielectric 105 may not be further recessed. For example, FIG. 5G(b) illustrates a diffusion barrier material 107 formed over the structure of FIG. 5E. The diffusion barrier material 107 may be used to suppress diffusion between an n-type dopant and p-type dopant. The diffusion barrier material 107 can be formed by depositing a dielectric such as silicon nitride over the n+ region 106 and the inter-dielectric 105 in the recess. Alternatively, the diffusion barrier material 107 can be formed by depositing a metal such as titanium nitride (TiN) over the n+ region 106 and the inter-dielectric 105 in the recess.

Figure 5H:
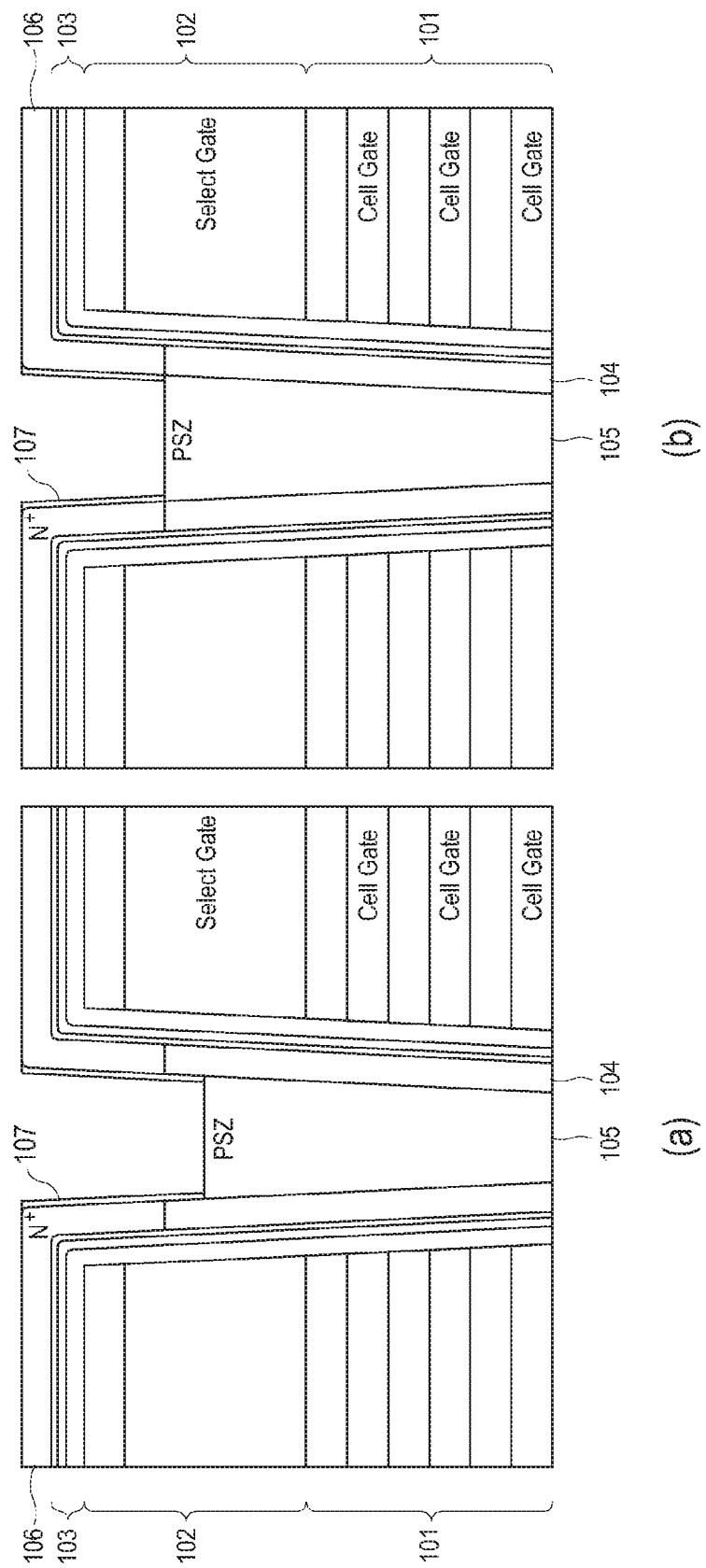

As shown in FIG. 5H, the diffusion barrier material 107 on an upper surface of the inter-dielectric 105 is removed (e.g., open etched) to expose the upper surface of the inter-dielectric 105. FIG. 5H(a) illustrates a structure formed subsequent to FIG. 5G(a), and FIG. 5H(b) illustrates a structure formed subsequent to FIG. 5G(b). The diffusion barrier material 107 on an upper surface of the n+ region 106 may be removed (e.g., space etched), exposing the upper surface of the n+ region 106.

Figure 5I:
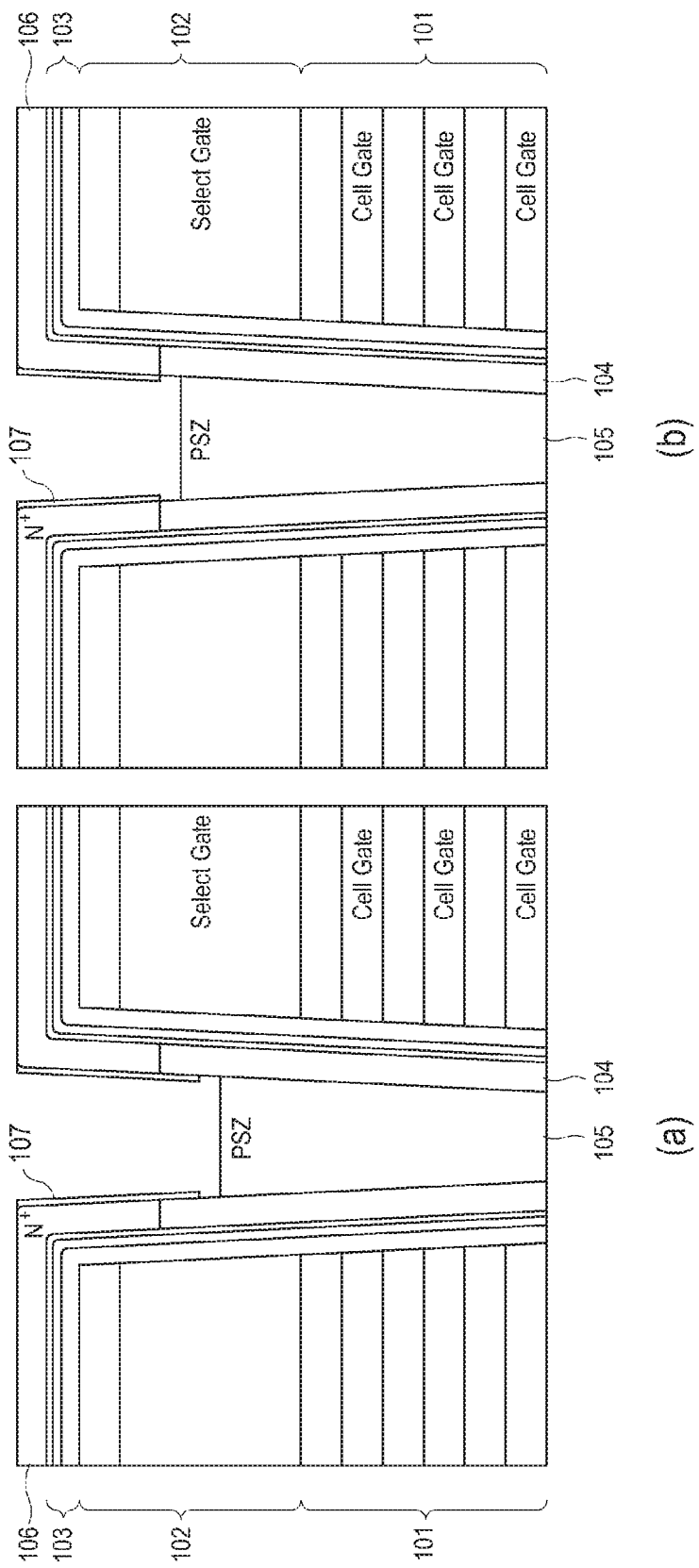

As shown in FIG. 5I, the upper surface of the inter-dielectric 105 may be further recessed to at least partially expose a region of the undoped poly-silicon material 104 adjacent to the n+ region 106. FIG. 5I(a) illustrates a structure formed subsequent to FIG. 5H(a), and FIG. 5I(b) illustrates a structure formed subsequent to FIG. 5H(b).

Figure 5J:
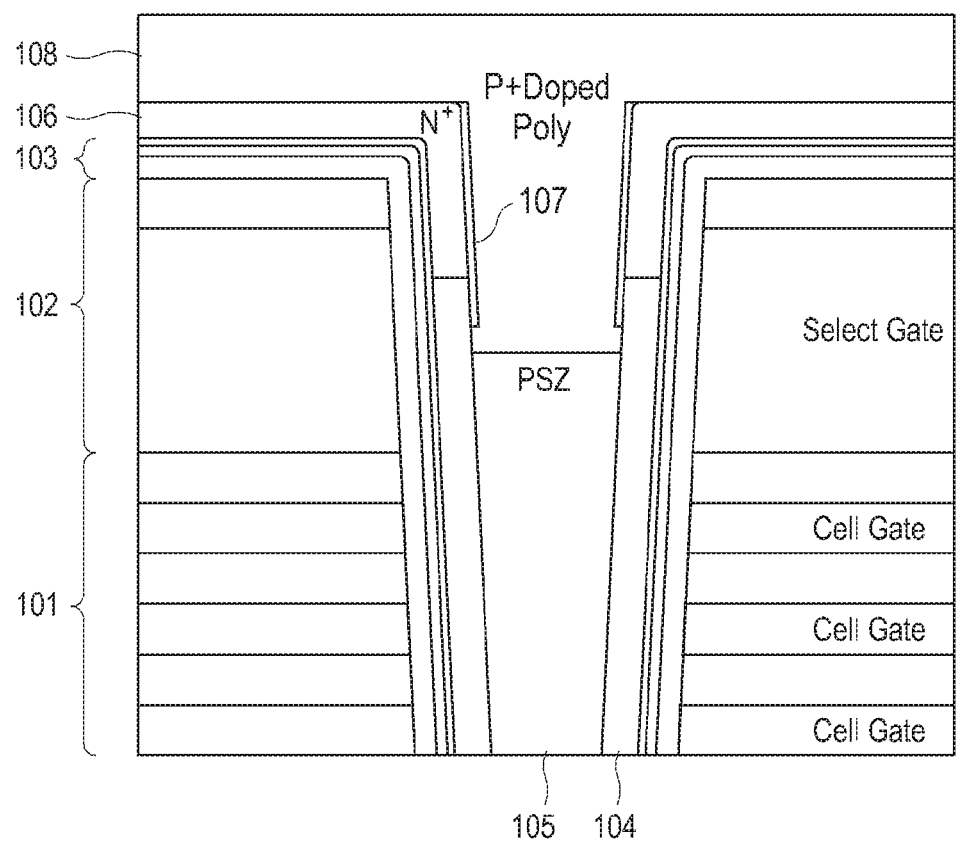

FIG. 5J depicts forming a p+ region 108 adjacent to the diffusion barrier material 107 in the recess. FIG. 5J illustrates a structure formed subsequent to FIG. 5H(a). Forming the p+ region 108 can comprise depositing a p+ doped poly-silicon over the inter-dielectric 105, the n+ region 106, and the diffusion barrier material 107 in the recess. The p+ doped poly silicon may be doped using, for example, boron. In some embodiments the concentration of an n-type dopant in the n+ region 106 is higher that the concentration of a p-type dopant in the p+ region 108. Even though the diffusion barrier material 107 separates the n+ region 106 and the p+ region 108, a p-type dopant such as boron can sometimes diffuse to the n+ region 106. In such a circumstance, the n+ region 106 can be maintained by the high concentration of the n-type dopant.

Figure 5K:
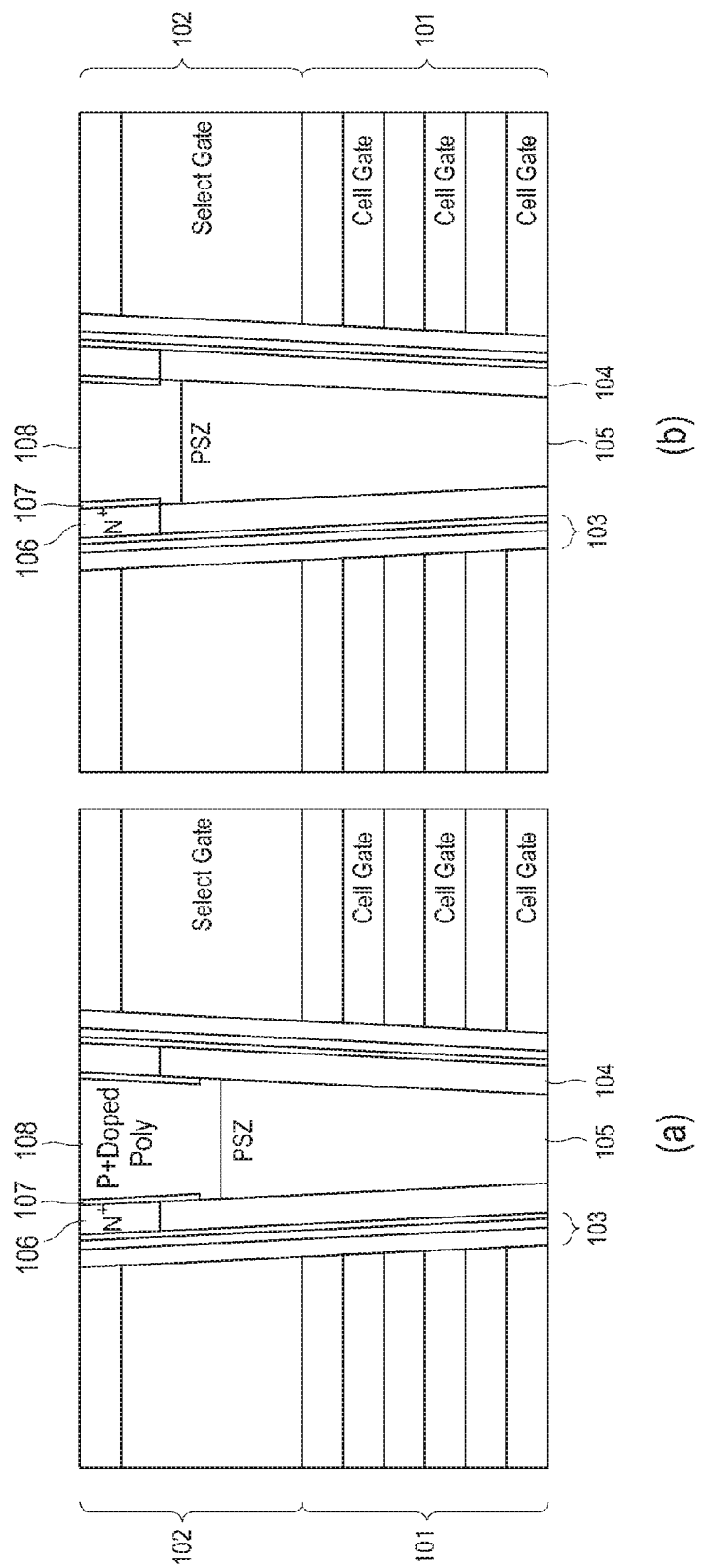

FIG. 5K depicts performing a CMP planarization process on the n+ region 106, the diffusion barrier material 107, and the p+ region 108. This process exposes an upper surface of the ONO layer 103. FIG. 5K(a) illustrates a structure formed subsequent to FIG. 5J, and FIG. 5K(b) illustrates a structure formed subsequent to FIG. 5H(b) after forming a p+ region 108 adjacent to the diffusion barrier material 107. The p+ doped poly-silicon region 108 is separated from the n+ region 106 by the diffusion barrier material 107, such as to reduce or prevent diffusion between the n+ doped poly-silicon and the p+ doped poly-silicon.

The posterior processes may be performed using any one of the 3D structured memory integration processes known or later developed in the related art.

Figure 6A:
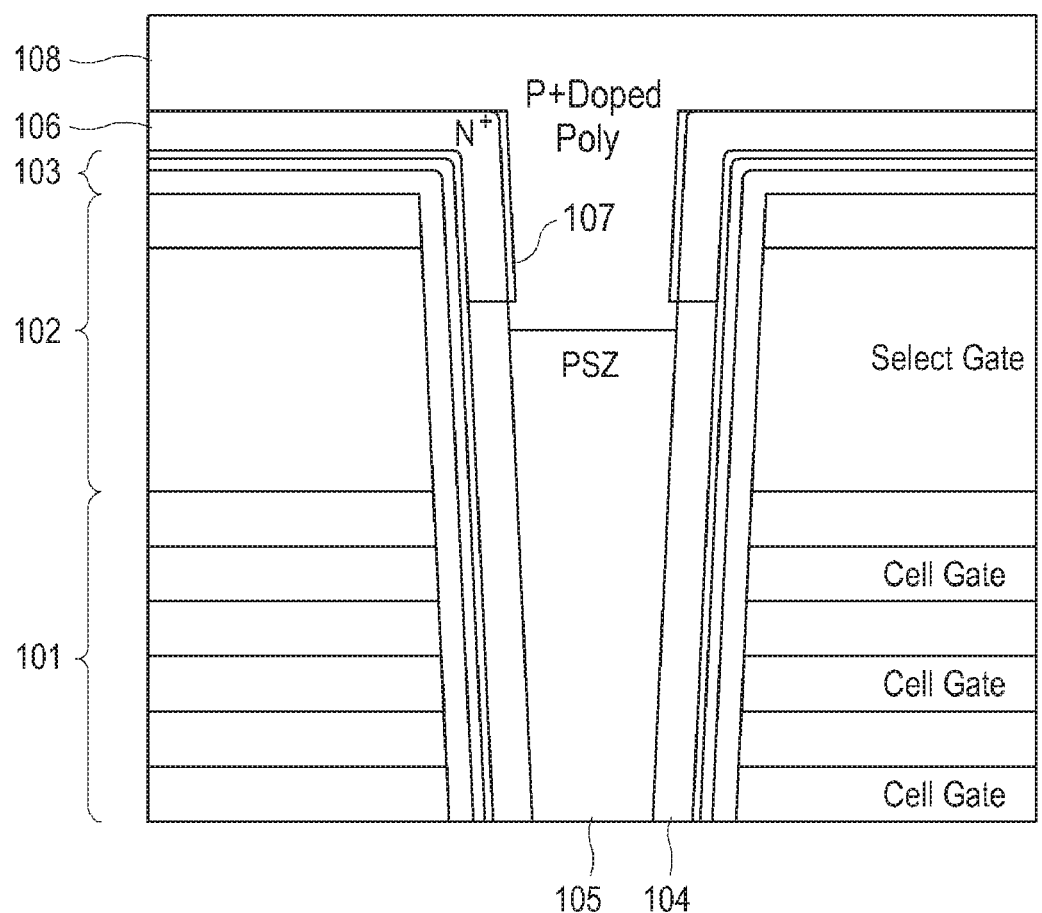
FIGS. 6A through 6B are cross-sectional views illustrating a method of manufacturing a 3d structured nonvolatile semiconductor memory device according to a second embodiment.
Figure 6B:
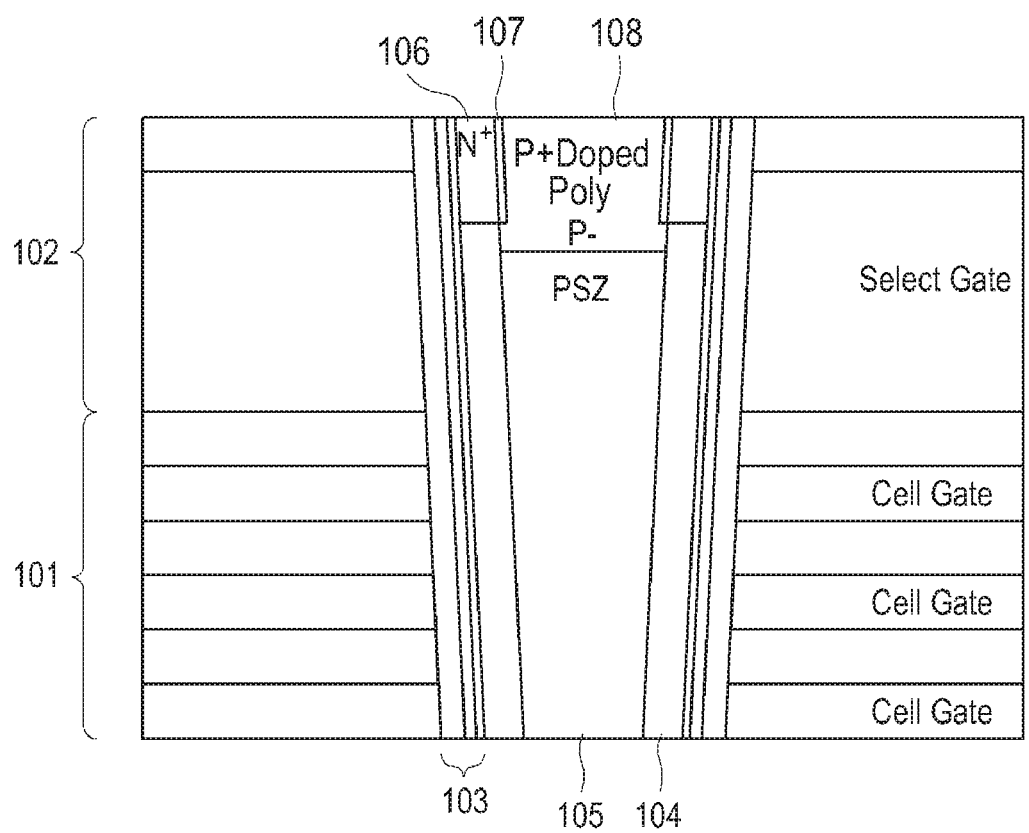

FIGS. 6A through 6B illustrate a method of manufacturing 3d structured nonvolatile semiconductor memory device having a cylindrical structure according to another embodiment of the present disclosure. FIGS. 6A through 6B, specifically, illustrate a method for forming an n+ region 106 and a p+ region 108 at a source/drain region of a 3D structured nonvolatile semiconductor memory device. In this embodiment, a p+ region 108 is formed by depositing an undoped poly-silicon over the n+ region 106 and the diffusion barrier material 107 and performing p+ implantation. The structure shown in FIG. 6A may be formed using the same steps as shown in FIGS. 5A through 5I. Thereafter, forming the p+ region 108 comprises depositing an undoped poly-silicon over the inter-dielectric 105, n+ region 106, and the diffusion barrier material 107.

FIG. 6B depicts performing a CMP planarization process on the n+ region 106, the diffusion barrier material 107, and the p+ region 108. This process exposes an upper surface of the ONO layer 103. The p+ region 108 and the n+ region 106 are separated by the diffusion barrier material 107, such as to reduce or prevent diffusion between the n+ doped poly-silicon and the p+ doped poly-silicon.

Forming the p+ region 108 further comprises implanting a p-type dopant into the undoped poly-silicon. The p-type dopant may be, for example, boron difluoride ($BF_2$). The concentration of a p-type dopant in the p+ region 108 may be lower than the concentration of an n-type dopant in the n+ region 106. The lower concentration allows for a p− region in the lower part of the p+ region 108. In some embodiments, it can provide the benefit of improving Vth stability for the selection transistor. Further p+ implantation can be performed at the source region selectively by a masking process.

FIGS. 7A through 7G illustrate a method of manufacturing 3d structured nonvolatile semiconductor memory device having a cylindrical structure according to still another embodiment of the present disclosure. FIGS. 7B through 7G, specifically, illustrate a method for forming an n+ region 110 and a p+ region 112 at a source/drain region of a 3D structured nonvolatile semiconductor memory device. The structure shown in FIG. 7A may be formed initially using the same steps as shown in FIGS. 5A and 5B. Thereafter, an insulative block layer 103a, a charge storage layer 103b, and an insulative tunneling layer 103c are sequentially formed over in the opening forming an ONO layer 103. The insulative block layer 103a may be a blocking oxide layer. The charge storage layer 103b may be a charge trap nitride layer. The insulative tunneling layer 103c may be a tunnel oxide layer. An undoped poly-silicon is then formed in the remaining portion of the opening, filling the channel with poly-silicon, thus forming an undoped channel poly-silicon 109.

Figure 7A:
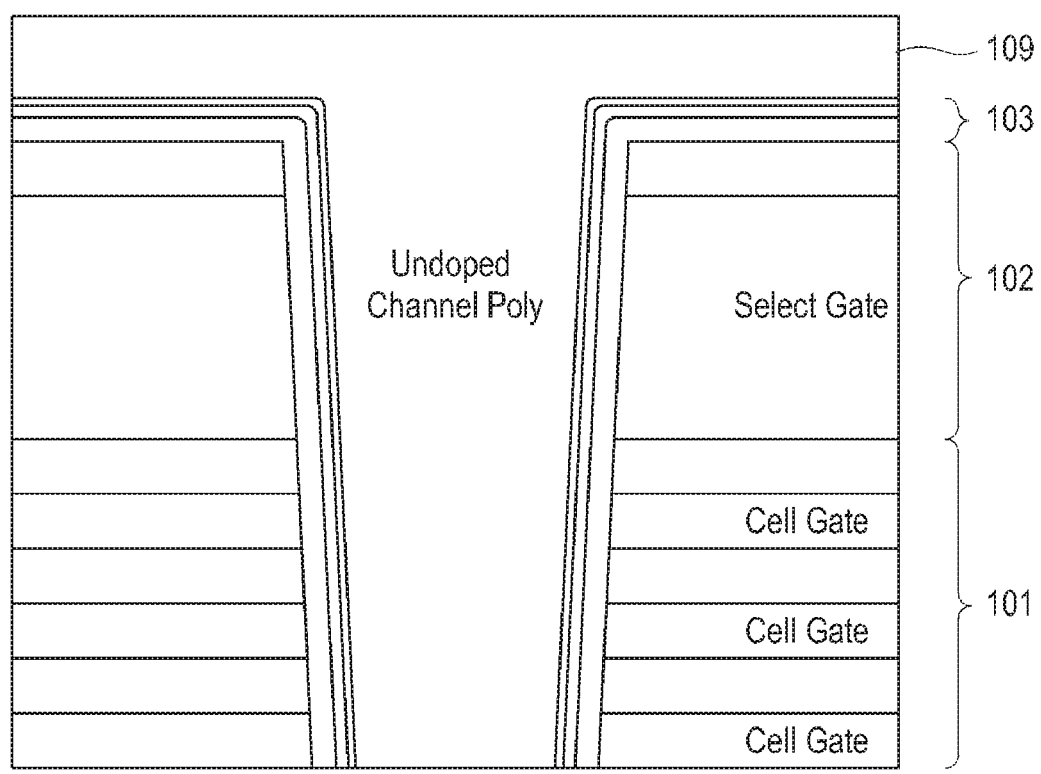
FIGS. 7A through 7G are cross-sectional views illustrating a method of manufacturing a 3d structured nonvolatile semiconductor memory device according to a third embodiment.
Figure 7B:
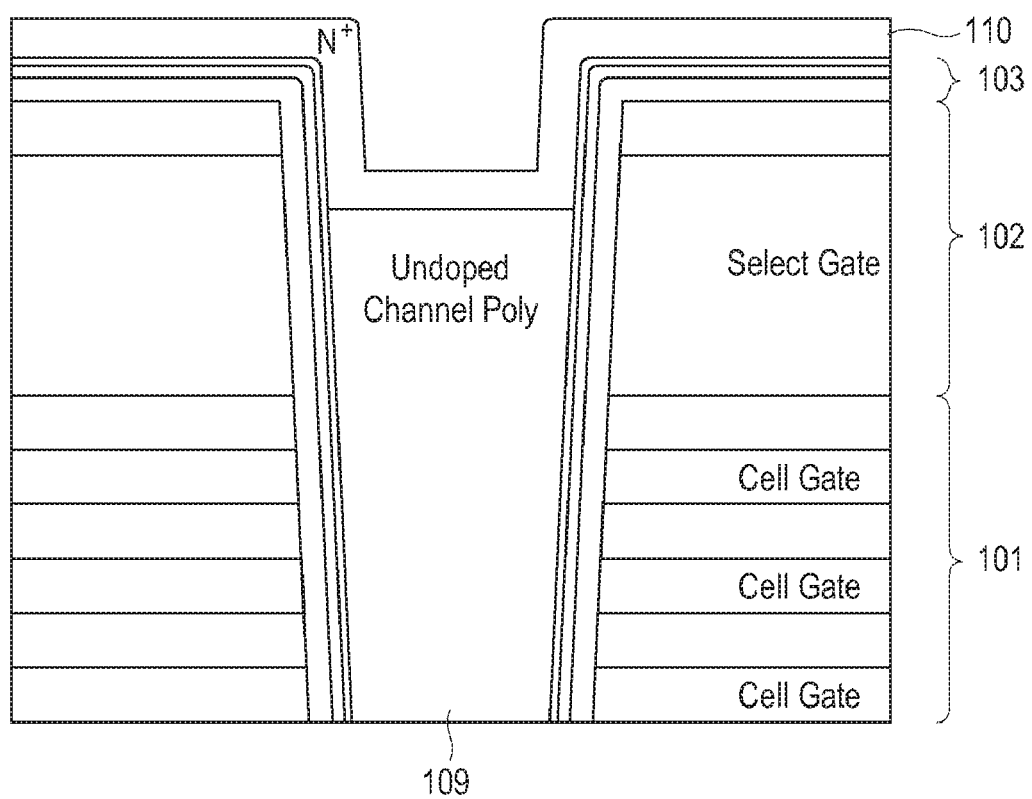
Figure 7C:
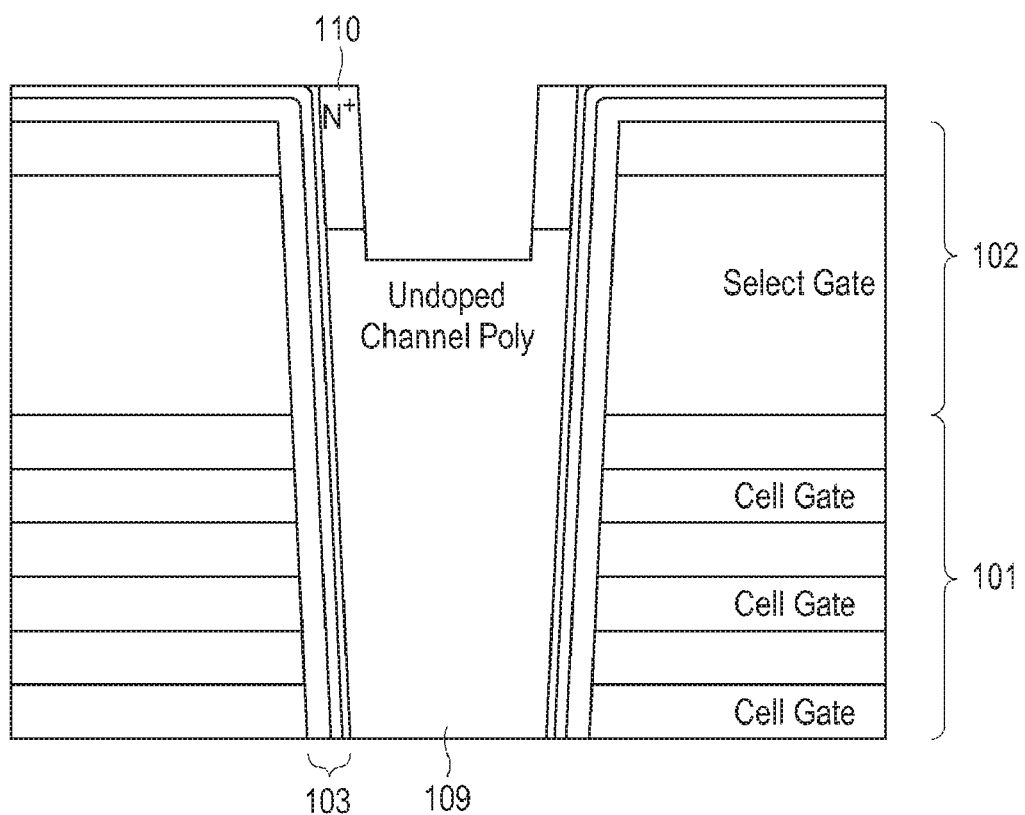

FIGS. 7B and 7C depict forming a n+ region 110. FIG. 7B depicts a structured formed by performing a CMP planarization process on the undoped channel poly-silicon 109, exposing an upper surface of the ONO layer 103. Then the undoped channel poly-silicon 109 is recessed forming a trench. Forming the n+ region further comprises depositing an n+ doped poly-silicon over the undoped channel poly-silicon 109 in the recess (e.g., the trench) to form the n+ region 110. The n+ doped poly-silicon may be doped using, for example, phosphine ($PH_3$).

FIG. 7C depicts removing the horizontal portion of the n+ region 110 in the recess and an upper portion of the undoped channel poly-silicon 109 below the removed horizontal portion of the n+ region 110 to expose a surface of the undoped channel poly-silicon 109. The horizontal portion of the n+ region 110 outside the recess may also be removed (e.g., space etched), exposing an upper surface of the ONO layer 103.

Figure 7D:
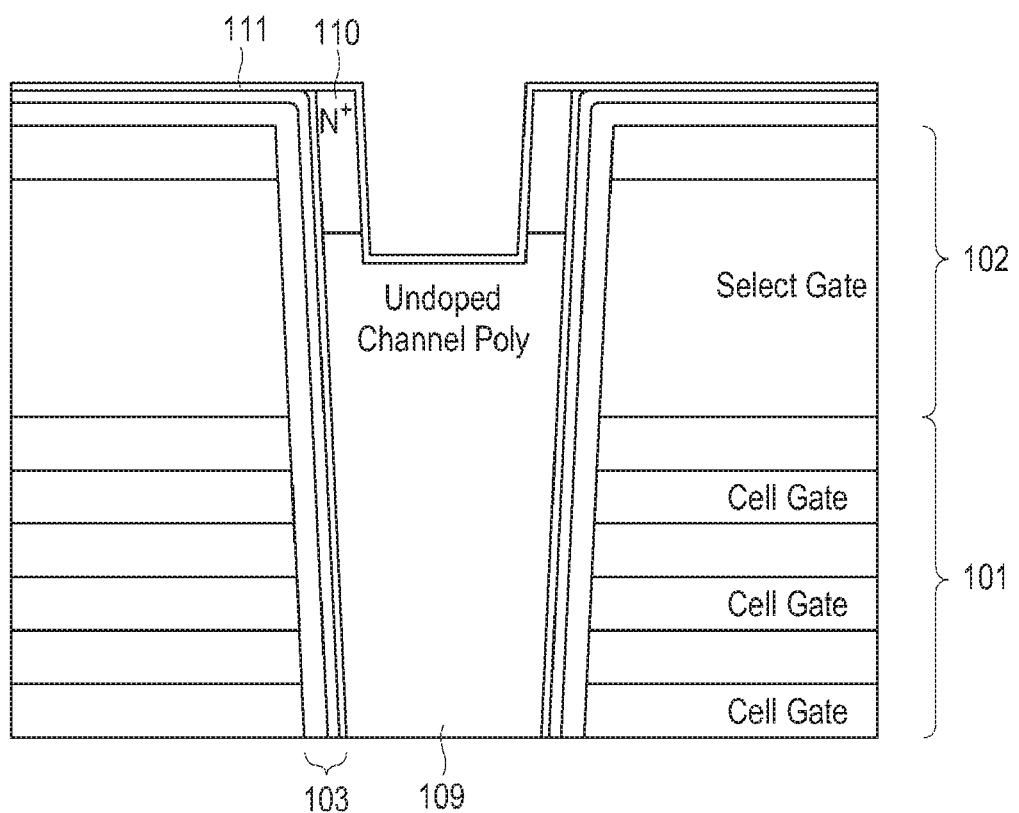
Figure 7E:
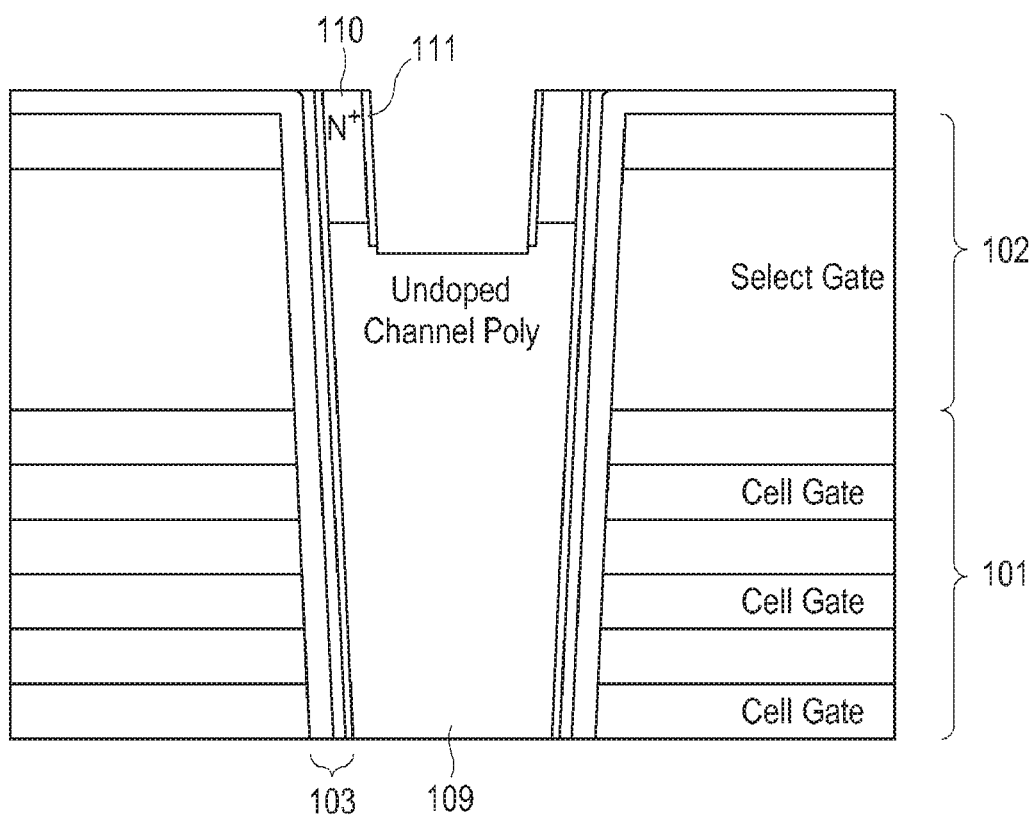

FIGS. 7D and 7E depict forming a diffusion barrier material 111 over the undoped channel poly-silicon 109 and the n+ region 110. The diffusion barrier material 111 can be used to suppress diffusion between an n-type dopant and p-type dopant. FIG. 7D depicts forming a diffusion barrier material 111 over the undoped channel poly-silicon 109 and the n+ region 110. The diffusion barrier material 111 can be formed by depositing a dielectric such as silicon nitride. Alternatively, the diffusion barrier material 111 can be formed by depositing, for example, a metal such as titanium nitride. FIG. 7E depicts removing (e.g., space etching) a horizontal portion of the diffusion barrier material 111 over the ONO layer 103, exposing a surface of the ONO layer 103, and removing a horizontal portion of the diffusion barrier material 111 in the recess to expose an upper surface of the undoped channel poly-silicon 109.

Figure 7F:
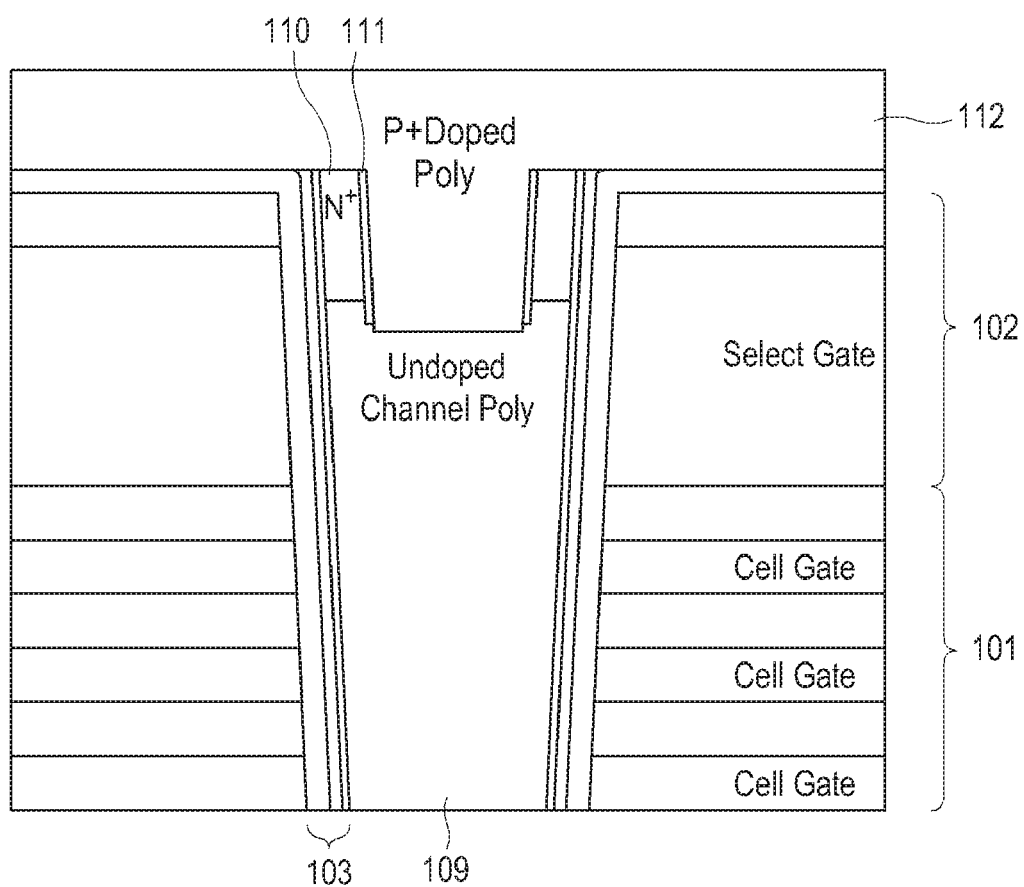
Figure 7G:
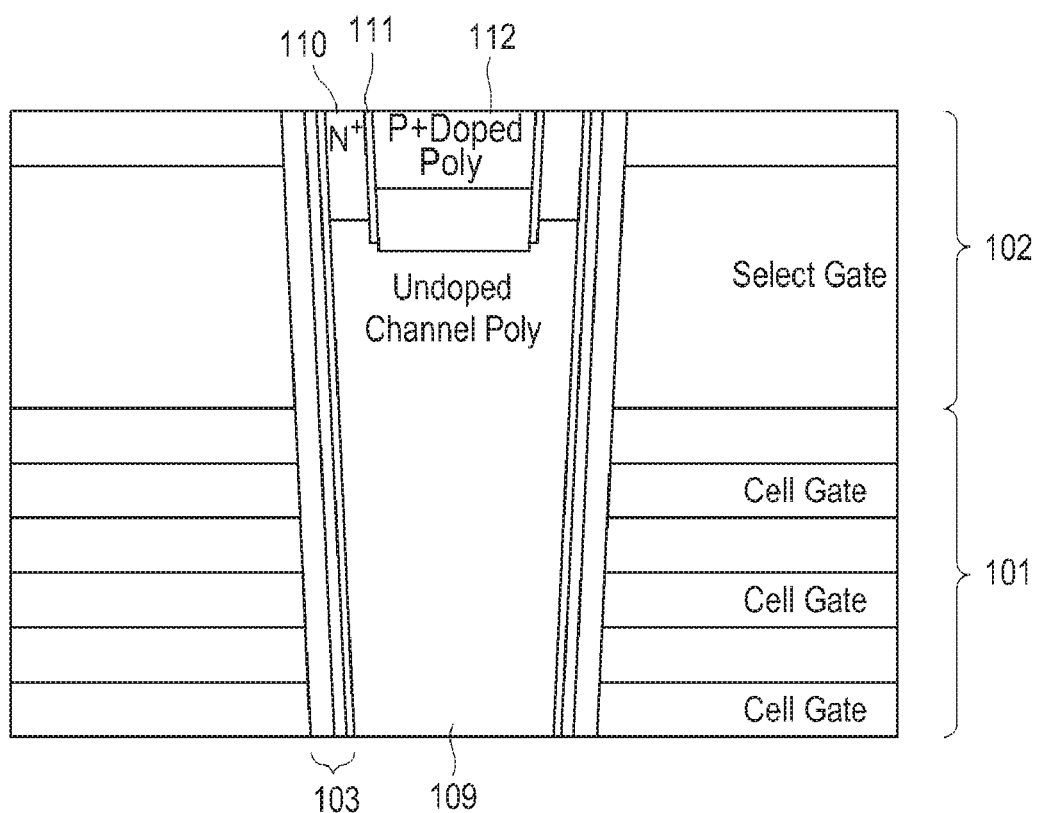

FIGS. 7F and 7G depict forming a p+ region 112 adjacent to the diffusion barrier material 111. FIG. 7F depicts forming a p+ doped poly-silicon over the undoped channel poly-silicon 109, the n+ region 110, and the diffusion barrier material 111 to form a p+ region 112. The p+ doped poly-silicon may be doped using, for example, boron. FIG. 7G depicts performing a CMP planarization process on the p+ region 112 exposing a surface of the ONO layer 103 (FIG. 7G). The p+ region 112 and the n+ region 110 are separated by the diffusion barrier material 111, such as to reduce or prevent diffusion between the n+ doped poly-silicon and the p+ doped poly-silicon.

Alternatively, an undoped poly-silicon may be formed over the undoped channel poly-silicon 109, the n+ region 110, and the diffusion barrier material 111 to form a p+ region 112 instead of forming a p+ doped poly-silicon over the undoped channel poly-silicon 109, the n+ region 110, and the diffusion barrier material 111. After performing a CMP planarization process on the undoped poly-silicon, a p-type dopant is then implanted into the p+ region 112 increasing the concentration of the p-type dopant in the p+ region 112. The p-type dopant may be, for example, $BF_2$.

Figure 8A:
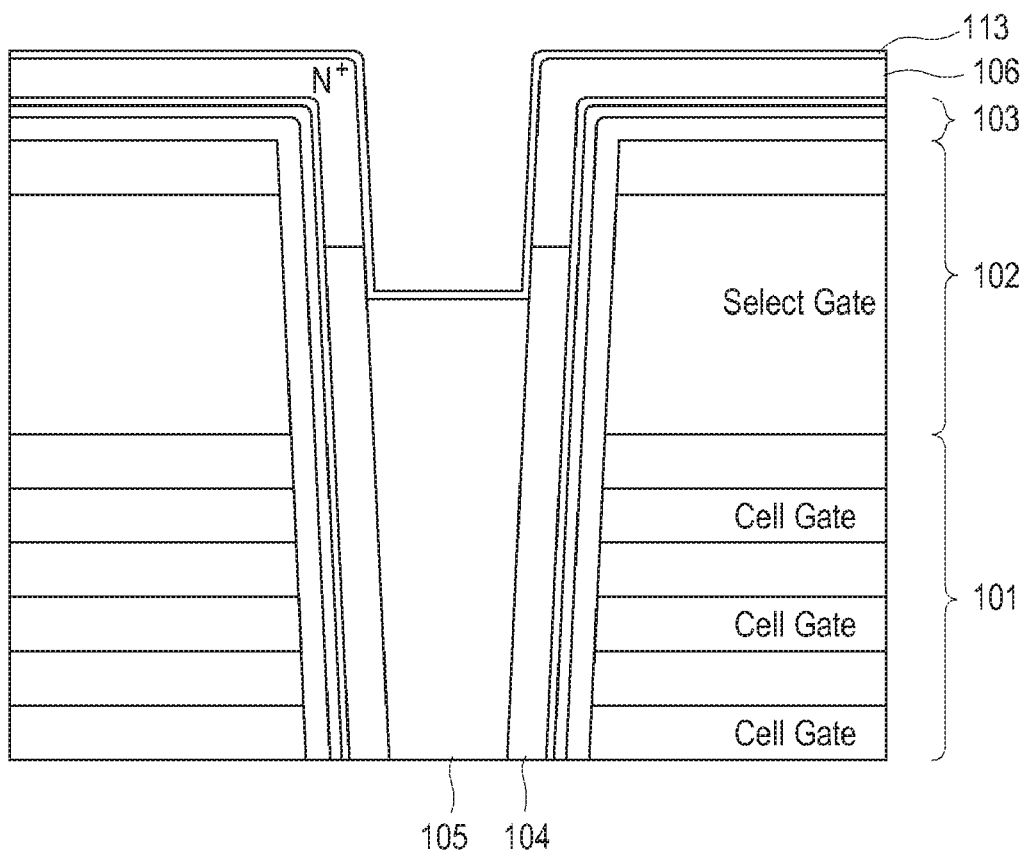
FIGS. 8A through 8C are cross-sectional views illustrating a method of manufacturing a 3d structured nonvolatile semiconductor memory device according to a fourth embodiment.
Figure 8B:
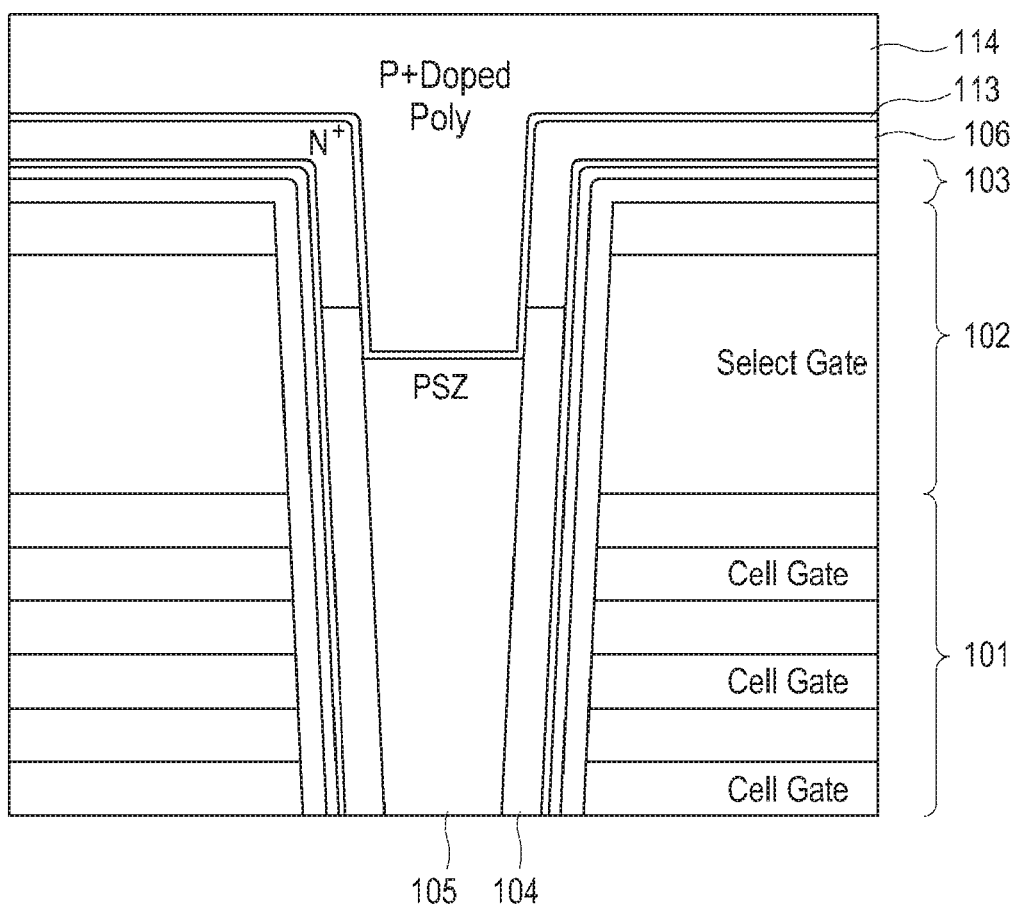
Figure 8C:
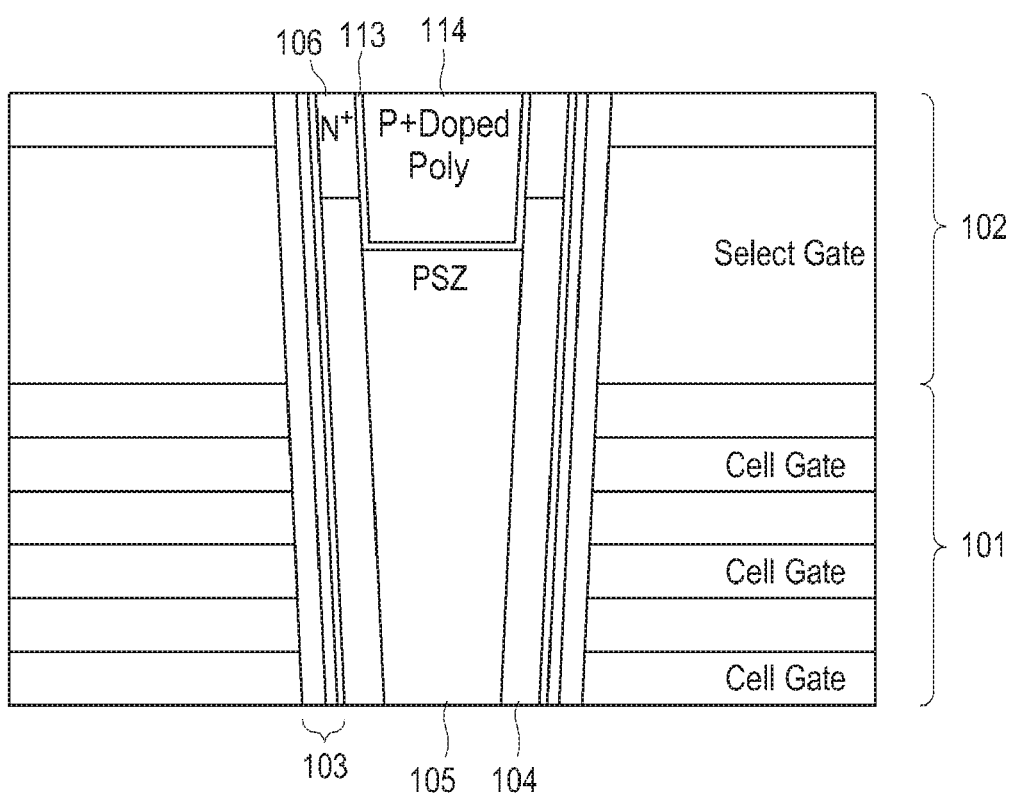

FIGS. 8A through 8C illustrate a method of manufacturing 3d structured nonvolatile semiconductor memory device having a cylindrical structure according to still another embodiment of the present disclosure. The structure shown in FIG. 8A may be formed initially using the same steps as shown in FIGS. 5A through 5G. FIG. 8A depicts forming a diffusion barrier material 113 by depositing a metal such as TiN over the undoped channel material 104, the inter-dielectric 105, and n+ region 106. The diffusion barrier material 113 is a conductive material.

FIGS. 8B and 8C depict forming a p+ region 114. FIG. 8B depicts forming a p+ doped poly-silicon over the diffusion barrier material 113 to form a p+ region 114. The p+ doped poly-silicon may be doped using, for example, boron. A CMP planarization process is then performed on the p+ region 114, the diffusion barrier material 113, and the n+ region 106 exposing the surface of the ONO layer 103 (FIG. 8C). The p+ region 114 and the n+ region 106 are separated by the diffusion barrier material 113, such as to reduce or prevent diffusion between the n+ doped poly-silicon and the p+ doped poly-silicon.

Figure 9:
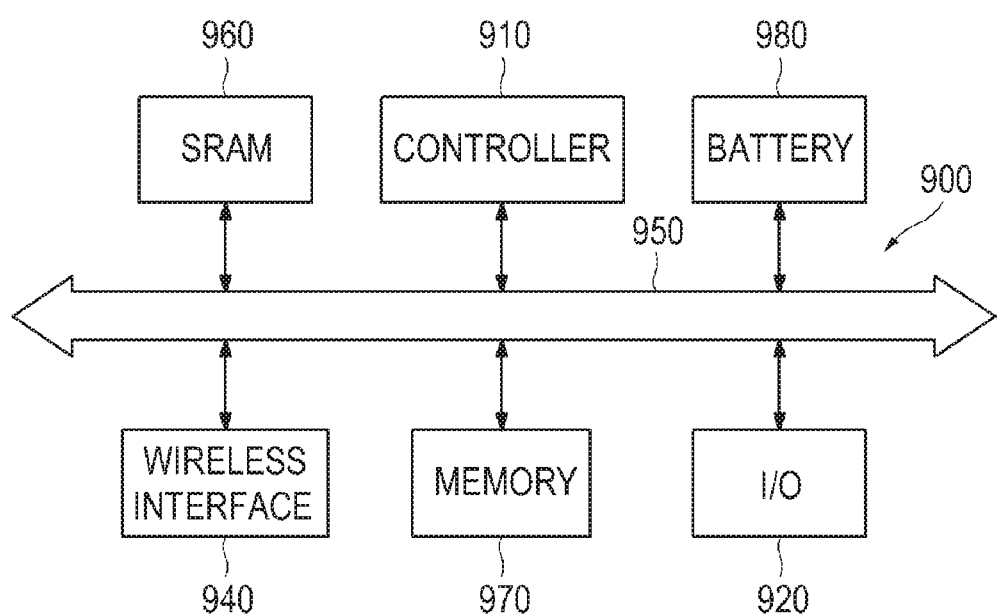
FIG. 9 shows a schematic diagram of an illustrative embodiment of a system including a 3d structured nonvolatile semiconductor memory device.

FIG. 9 shows a schematic diagram of an illustrative embodiment of a system including a 3d structure nonvolatile semiconductor memory device (e.g., the memory device as shown in FIG. 1). A system 900 may be used in devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information either wirelessly or over a wire connection. The system 900 may be used in any of the following systems: a wireless local area network (WLAN) system, a wireless personal area network (WPAN) system, or a cellular network.

The system 900 may include a controller 910, an input/output (I/O) device 920 (e.g., a keypad, display), a non-volatile memory device 970 (e.g., the memory device of FIG. 1), a wireless interface 940, and a static random access memory (SRAM) 960 and coupled to each other via a bus 950. A battery 980 may supply power to the system 900 in one embodiment. The memory device may include a NAND memory, a flash memory, a NOR memory, or the like.

The controller 910 may include, for example, one or more microprocessors, digital signal processors, micro-controllers, or the like. The non-volatile memory device 970 may be used to store messages transmitted to or by the system 900. The non-volatile memory device 970 may also optionally be used to store instructions that are executed by controller 920 during the operation of the system 900, and may be used to store user data either generated, collected or received by the system 900 (such as image data). The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information.

The I/O device 920 may be used to generate a message. The system 900 may use the wireless interface 940 to transmit and receive messages to and from a wireless communication network with a radio frequency (RF) signal. Examples of the wireless interface 940 may include an antenna, or a wireless transceiver, such as a dipole antenna, although the scope of the present invention is not limited in this respect. Also, the I/O device 920 may deliver a voltage reflecting what is stored as either a digital output (if digital information was stored), or as analog information (if analog information was stored). While an example in a wireless application is provided above, embodiments of the present invention may also be used in non-wireless applications as well.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and devices within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third, and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A three-dimensional structured memory device, comprising:
   a vertical string of memory cells including a vertically extending channel material of the string of memory cells, the vertically extending channel material defining a central vertical opening;
   a dielectric material formed within the central vertical opening within a first portion of the channel material, with a second portion of the channel material extending above the dielectric material; the second portion of the channel material doped with a dopant of a first polarity; and
   a diffusion barrier extending within the central vertical opening and between the second portion of the channel material and a second conductive material formed over the diffusion barrier, the second conductive material being doped with a second dopant having a polarity opposite that of the first dopant.

2. The three-dimensional structured memory device of claim 1, wherein the channel material doped with the dopant of the first polarity and the second conductive material doped with the second dopant form a source/drain region.

3. The three-dimensional structured memory device of claim 1, further comprising a recessed portion formed below the diffusion barrier.

4. The three-dimensional structured memory device of claim 3, wherein the channel material proximate to the recessed portion is doped with a n-type dopant to form n-type regions.

5. The three-dimensional structured memory device of claim 1, wherein the second conductive material is doped with a p-type dopant.

6. The three-dimensional structured memory device of claim 1, wherein a region having a positive polarity formed at a source/drain region is configured to provide holes for hole injection so as to perform an erase operation without forming gate-induced drain leakage (GIDL).

7. A method of forming a three-dimensional memory device, the method comprising:
   forming alternating tiers of conductive material and a first dielectric material on a substrate, wherein each tier of conductive material is separated from another tier of conductive material by a tier of the first dielectric material;
   forming a vertically extending channel opening through the alternating tiers;
   forming a vertical string of memory cells including forming a vertically extending channel material on sidewalls of the vertically extending channel opening;
   forming a second dielectric material within a first portion of the channel material;
   doping a second portion of the channel material extending above the second dielectric material with a dopant of a first polarity;
   forming a diffusion barrier within the central opening adjacent the first portion of the channel material; and
   forming a second conductive material formed over the diffusion barrier, the second conductive material being doped with a second dopant having a polarity opposite that of the first dopant.

8. The method of claim 7, wherein the first portion of the channel material is undoped.

9. The method of claim 7, further comprising forming a recessed portion in the second dielectric material prior to forming the diffusion barrier.

10. The method of claim 7, further comprising performing a chemical-mechanical planarization process to remove portions of the second dielectric material overlying an uppermost portion of the second portion of the channel material.

11. The method of claim 7, wherein, prior to forming the channel material, the method further comprises:
    forming a third dielectric material over the sidewalls of the opening;
    forming a charge storage material over the third dielectric material; and
    forming a fourth dielectric material over the charge storage material.

12. The method of claim 11, wherein a combination of the third dielectric material, the charge storage material, and the fourth dielectric material comprises an oxide-nitride-oxide (ONO) layer.

13. The method of claim 7, further comprising further selectively recessing the second dielectric material to expose an additional region of the channel material after doping the second portion of the channel material extending above the second dielectric material.

14. The method of claim 7, further comprising, prior to forming the second conductive material over the diffusion barrier, etching a portion of the diffusion barrier thereby exposing an uppermost portion of the second dielectric material.

15. The method of claim 7, further comprising, prior to forming the diffusion barrier and forming the second conductive material, further recessing a portion of the second dielectric material thereby exposing additional portions of the channel material.

16. The method of claim 7, wherein the channel material comprises a U-shape formed in adjacent portions of the alternating levels of the first conductive material and the first dielectric material, with a lower connecting-portion of the U-shaped portion formed in a substrate over which such alternating levels are formed.

17. A method, comprising:
    forming alternating tiers of conductive material and dielectric material on a substrate, wherein each tier of conductive material is separated from another tier of conductive material by a tier of dielectric material;
    forming a vertically extending channel opening through the alternating tiers;
    forming a channel material over at least sidewalls of the vertically extending channel opening;
    at least partially filling a remaining portion of the vertically extending channel opening within the channel material with an inter-dielectric material;
    selectively recessing a portion of the inter-dielectric material to expose a region of the channel material;
    doping the exposed region to form a first doped region having a first polarity;
    forming a diffusion barrier layer over the first doped region; and
    at least partially filling a remaining portion of the recessed portion with a second doped material having a polarity opposite that of the first doped region.

18. The method of claim 17, further comprising, prior to forming the channel material over the sidewalls:
    forming an insulative blocking material adjacent to the sidewalls;
    forming a charge storage material over the insulative blocking material; and
    forming a insulative tunneling material over the charge storage material.

* * * * *